(12) United States Patent
Gao et al.

(10) Patent No.: US 10,804,926 B2
(45) Date of Patent: Oct. 13, 2020

(54) CHARGE LEAKAGE COMPENSATION IN ANALOG-TO-DIGITAL CONVERTER

(71) Applicant: Facebook Technologies, LLC, Menlo Park, CA (US)

(72) Inventors: Wei Gao, Bothell, WA (US); Andrew Samuel Berkovich, Redmond, WA (US); Xinqiao Liu, Medina, WA (US); Song Chen, Redmond, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/286,355

(22) Filed: Feb. 26, 2019

(65) Prior Publication Data
US 2019/0379388 A1    Dec. 12, 2019

Related U.S. Application Data

(60) Provisional application No. 62/682,647, filed on Jun. 8, 2018.

(51) Int. Cl.
*H03M 1/80*    (2006.01)
*H03M 1/36*    (2006.01)

(52) U.S. Cl.
CPC ........... *H03M 1/804* (2013.01); *H03M 1/361* (2013.01)

(58) Field of Classification Search
CPC .................................................. H03M 1/804
(Continued)

(56) References Cited

U.S. PATENT DOCUMENTS

| 8,134,623 B2 | 3/2012 | Purcell et al. |
| 8,779,346 B2 | 7/2014 | Fowler et al. |

(Continued)

FOREIGN PATENT DOCUMENTS

EP    1746820 A1    1/2007

OTHER PUBLICATIONS

U.S. Appl. No. 15/847,517, "Non-Final Office Action", dated Nov. 23, 2018, 21 pages.
(Continued)

*Primary Examiner* — Peguy Jean Pierre
(74) *Attorney, Agent, or Firm* — Kilpatrick Townsend & Stockton LLP

(57) ABSTRACT

Methods and systems for performing analog-to-digital conversion is provided. In one example, an analog-to-digital converter (ADC) circuit comprises a leakage compensation circuit and a quantizer. The leakage compensation circuit is configured to: receive an input signal, the input signal being susceptible to a drift due to a charge leakage; receive a reference signal; and generate a leakage-compensated signal pair to compensate for the charge leakage, wherein the leakage-compensated signal pair comprises one of: (a) a leakage-compensated version of the input signal and the reference signal, (b) the input signal and a leakage-compensated version of the reference signal, or (c) a leakage-compensated version of the input signal and a leakage-compensated version of the reference signal. The quantizer is configured to perform a leakage-compensated quantization of the input signal based on the leakage-compensated signal pair to generate a digital output representing the input signal.

22 Claims, 22 Drawing Sheets

(58) Field of Classification Search
USPC .............................. 341/155, 120, 118, 172
See application file for complete search history.

(56) References Cited

U.S. PATENT DOCUMENTS

| | | | |
|---|---|---|---|
| 9,094,629 | B2 | 7/2015 | Ishibashi |
| 9,274,151 | B2 * | 3/2016 | Lee ...................... G01R 23/005 |
| 9,363,454 | B2 | 6/2016 | Ito et al. |
| 9,909,922 | B2 * | 3/2018 | Schweickert .......... G02C 7/049 |
| 2003/0020100 | A1 | 1/2003 | Guidash |
| 2005/0057389 | A1 | 3/2005 | Krymski |
| 2007/0208526 | A1 * | 9/2007 | Staudt ................. G01R 31/2884 |
| | | | 702/117 |
| 2007/0222881 | A1 | 9/2007 | Mentzer |
| 2008/0191791 | A1 * | 8/2008 | Nomura ............. H03K 19/0008 |
| | | | 327/540 |
| 2010/0276572 | A1 | 11/2010 | Iwabuchi et al. |
| 2011/0254986 | A1 | 10/2011 | Nishimura et al. |
| 2012/0133807 | A1 | 5/2012 | Wu et al. |
| 2012/0138775 | A1 * | 6/2012 | Cheon .................... H04N 5/361 |
| | | | 250/208.1 |
| 2012/0262616 | A1 | 10/2012 | Sa et al. |
| 2013/0056809 | A1 | 3/2013 | Mao et al. |
| 2013/0057742 | A1 | 3/2013 | Nakamura et al. |
| 2013/0141619 | A1 | 6/2013 | Lim et al. |
| 2013/0207219 | A1 | 8/2013 | Ahn |
| 2013/0299674 | A1 | 11/2013 | Fowler et al. |
| 2014/0042299 | A1 | 2/2014 | Wan et al. |
| 2015/0189209 | A1 | 7/2015 | Yang et al. |
| 2015/0208009 | A1 | 7/2015 | Oh et al. |
| 2015/0237274 | A1 | 8/2015 | Yang et al. |
| 2015/0279884 | A1 | 10/2015 | Kusumoto |
| 2015/0312502 | A1 | 10/2015 | Borremans |
| 2016/0028974 | A1 | 1/2016 | Guidash et al. |
| 2016/0088253 | A1 | 3/2016 | Tezuka |
| 2016/0100115 | A1 | 4/2016 | Kusano |
| 2016/0165160 | A1 | 6/2016 | Hseih et al. |
| 2016/0249004 | A1 | 8/2016 | Saeki et al. |
| 2016/0360127 | A1 | 12/2016 | Dierickx et al. |
| 2017/0069363 | A1 | 3/2017 | Baker |
| 2018/0077368 | A1 | 3/2018 | Suzuki |

OTHER PUBLICATIONS

Cho, et al., "A Low Power Dual CDS for a Column-Parallel CMOS Image Sensor", Journal of Semiconductor Technology and Science, vol. 12, No. 4, Dec. 2012, 9 pages.
European Application No. EP18179838.0, "Partial European Search Report", dated Dec. 5, 2018, 14 pages.
European Application No. EP18179846.3, "Extended European Search Report", dated Dec. 7, 2018, 10 pages.
European Application No. EP18179851.3, "Extended European Search Report", dated Dec. 7, 2018, 8 pages.
International Application No. PCT/US2018/039350, "International Search Report and Written Opinion", dated Nov. 15, 2018, 13 pages.
International Application No. PCT/US2018/039352, "International Search Report and Written Opinion", dated Oct. 26, 2018, 10 pages.
International Application No. PCT/US2018/039431, "International Search Report and Written Opinion", dated Nov. 7, 2018, 14 pages.
International Search Report and Written Opinion—PCT/US2019/019756—ISA/KR—Jun. 13, 2019 (11 pp.).

* cited by examiner

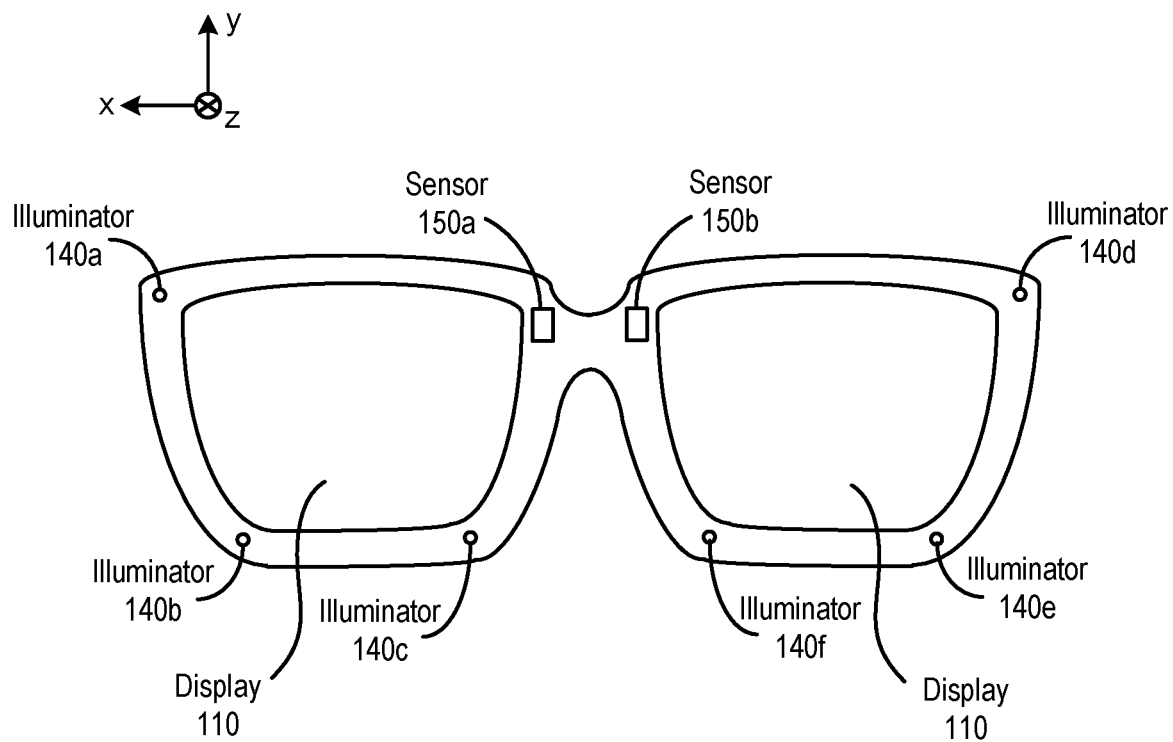
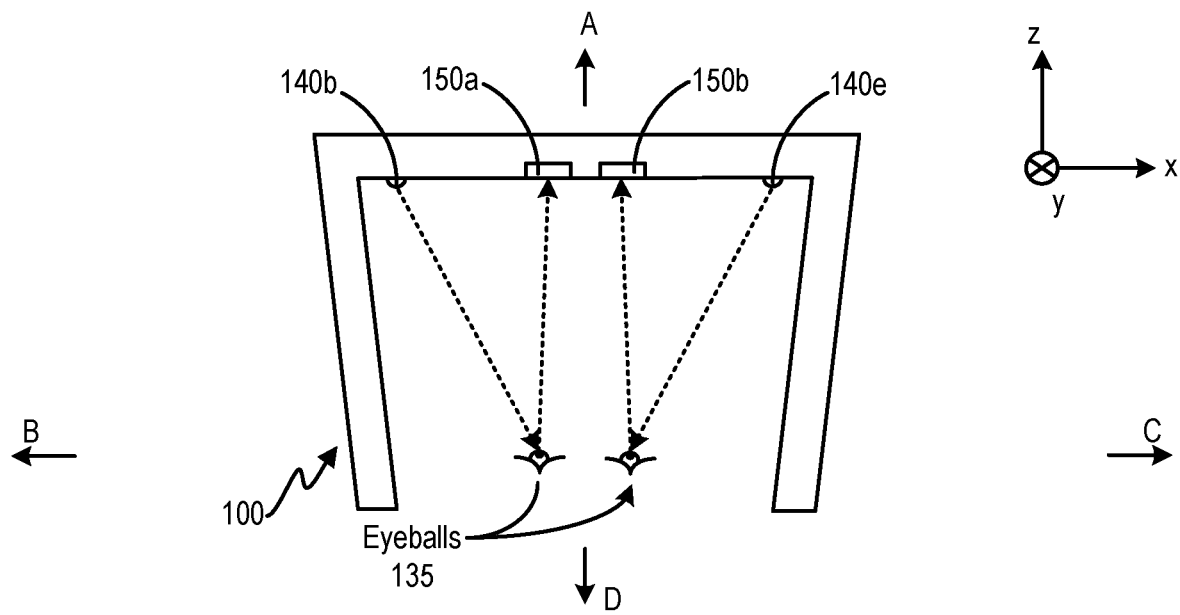
FIG. 1B

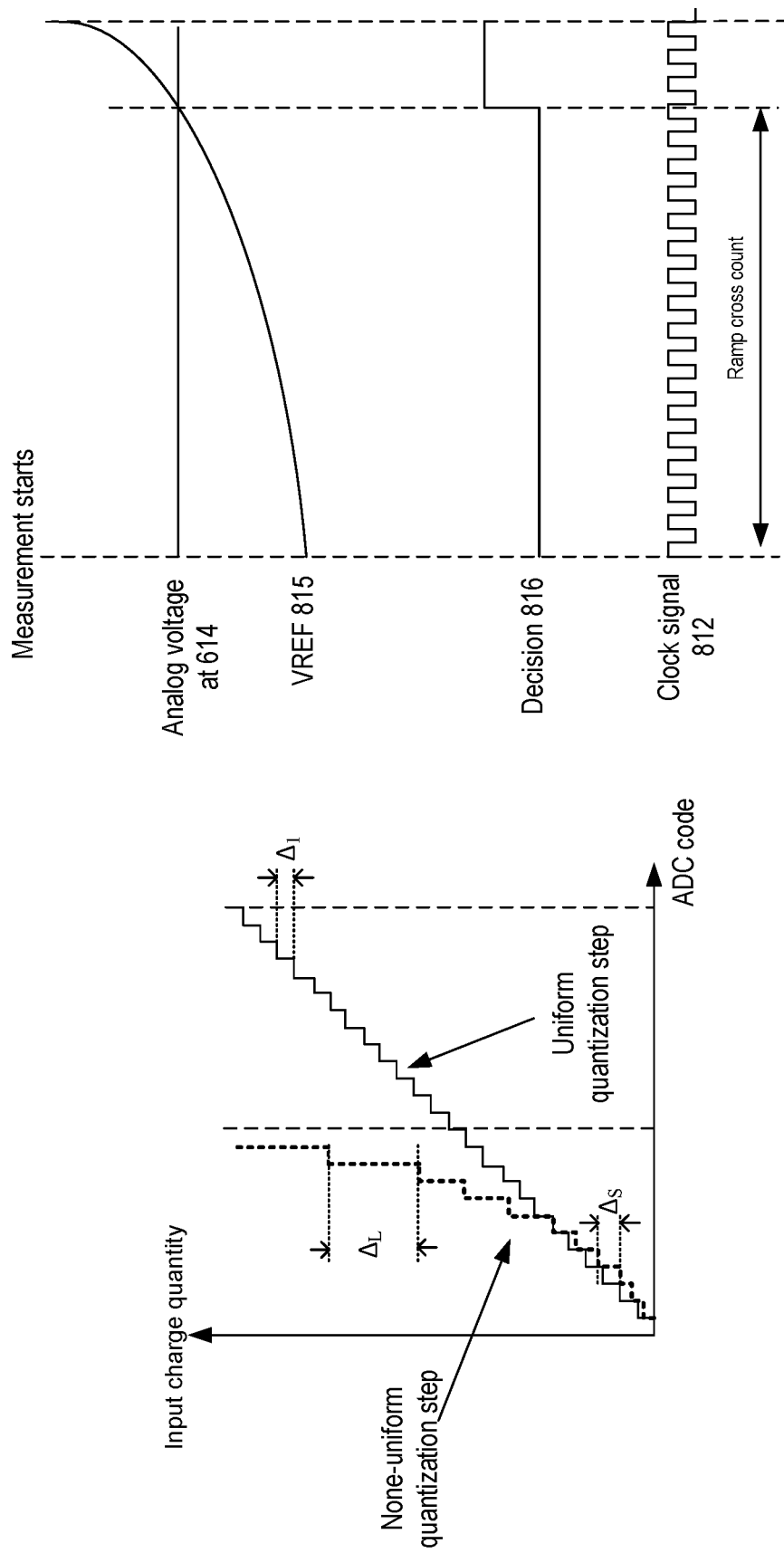

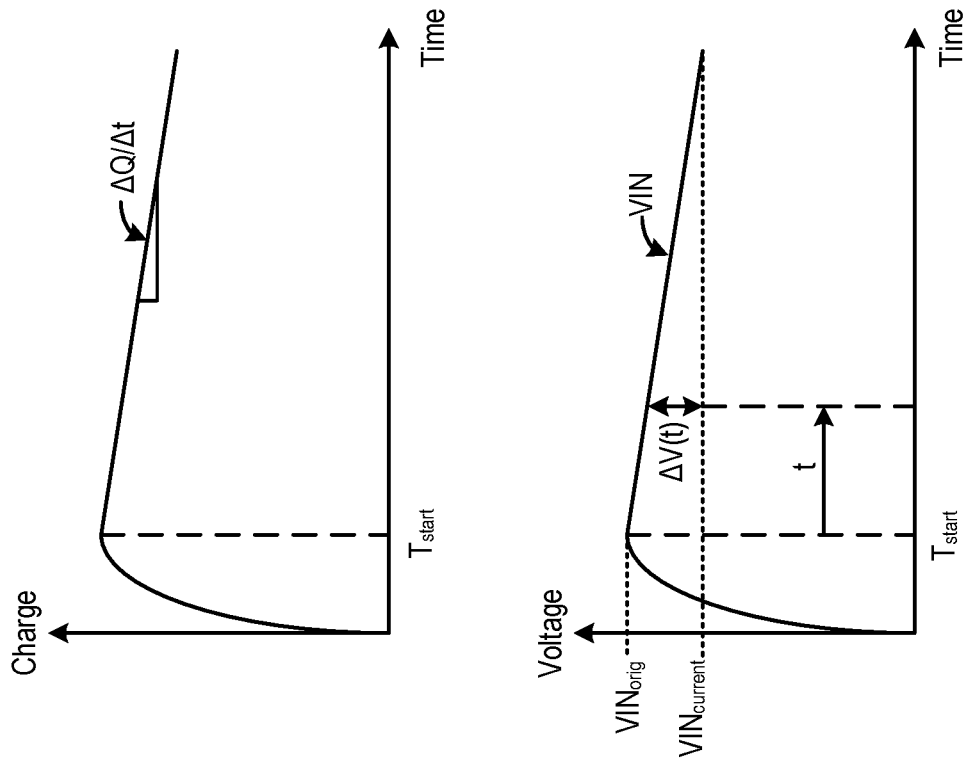
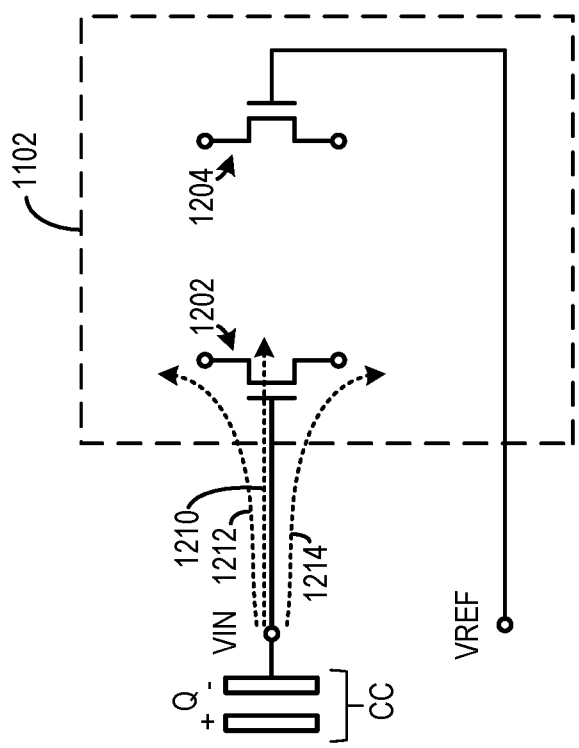
FIG. 12

US 10,804,926 B2

CHARGE LEAKAGE COMPENSATION IN ANALOG-TO-DIGITAL CONVERTER

RELATED APPLICATION

This patent application claims priority to U.S. Provisional Patent Application Ser. No. 62/682,647, filed Jun. 8, 2018, entitled "Comparator Input Gate Leakage Compensation Schemes for Analog-to-Digital Converter," which is assigned to the assignee hereof and is incorporated herein by reference in its entirety for all purposes.

BACKGROUND

The disclosure relates generally to image sensors, and more specifically to pixel cell structure including interfacing circuitries for determining light intensity for image generation.

A typical image sensor includes a photodiode to sense incident light by converting photons into charge (e.g., electrons or holes). The image sensor further includes a floating node configured as a capacitor to collect the charge generated by the photodiode during an exposure period. The collected charge can develop a voltage at the capacitor. The voltage can be buffered and fed to an analog-to-digital converter (ADC), which can quantize the voltage into a digital value representing the intensity of the incident light. The accuracy of the quantization, however, can be affected by various factors, such as charge leakage.

SUMMARY

The present disclosure relates to image sensors. More specifically, and without limitation, this disclosure relates to a pixel cell to measure the intensity of incident light. This disclosure also relates to processing circuitries of a pixel cells that generate digital representations of the measured intensity.

In one example, an analog-to-digital converter (ADC) circuit is provided. The ADC circuit comprises a leakage compensation circuit and a quantizer. The leakage compensation circuit is configured to receive an input signal, the input signal being susceptible to a drift due to a charge leakage. The leakage compensation circuit is also configured to receive a reference signal, and generate a leakage-compensated signal pair to compensate for the charge leakage, wherein the leakage-compensated signal pair comprises one of: (a) a leakage-compensated version of the input signal and the reference signal, (b) the input signal and a leakage-compensated version of the reference signal, or (c) a leakage-compensated version of the input signal and a leakage-compensated version of the reference signal. The quantizer is configured to perform a leakage-compensated quantization of the input signal based on the leakage-compensated signal pair to generate a digital output representing the input signal.

In some aspects, the quantizer comprises a comparator having a first transistor and a second transistor. A first gate terminal of the first transistor is configured to receive a first signal of the leakage-compensated signal pair, the first signal being one of the input signal or the leakage-compensated version of the input signal, the input signal being susceptible to drift due to charge leakage from the first gate terminal. A second gate terminal of the second transistor is configured to receive a second signal of the leakage-compensated signal pair, the second signal being one of the reference signal or the leakage-compensated version of the reference signal of the input signal of the leakage-compensated signal pair. The comparator is configured to generate a comparison result based on the leakage-compensated signal pair. The quantizer is configured to generate the digital output based on the comparison result.

In some aspects, the quantizer comprises a counter configured to periodically update a count value within the measurement period until the comparison result of the comparator switches. The digital output is based on the last-updated count value.

In some aspects, the input signal is an internal input signal. The ADC circuit comprises: an input terminal configured to receive an external input signal; and a capacitor coupled between the input terminal and the first gate terminal of the comparator and configured to store information for an auto-zeroing operation of the comparator and to output the internal input signal to the first gate terminal based on the external input signal and the stored information. The leakage compensation circuit is configured to generate the leakage-compensated signal pair to compensate for charge leakage from the capacitor via the first gate terminal of the comparator within the measurement period.

In some aspects, the leakage compensation circuit is configured to generate the leakage-compensated version of the reference signal from the reference signal based on introducing a time-varying offset with respect to the reference signal, the offset corresponding to an accumulative quantity of charge leaked via the second gate terminal since the measurement period starts.

In some aspects, the capacitor is a first capacitor. The reference signal is an internal reference signal. The ADC circuit further includes a reference terminal to receive an external reference signal. The leakage compensation circuit comprises a second capacitor coupled between the reference terminal and the second gate terminal, the second capacitor being configured to output the leakage-compensated reference signal to the second gate terminal based on the external reference signal while allowing the leakage-compensated reference signal to drift at the second gate terminal. The drift of the leakage-compensated reference signal at the second gate terminal tracks the drift of the internal input signal at the first gate terminal. The drift of the leakage-compensated reference signal introduces the time-varying offset with respect to the input reference signal.

In some aspects, in a first mode of measurement, the ADC circuit is configured to: connect the second gate terminal to a signal source of the external reference signal before the measurement period starts to initialize the leakage-compensated reference signal to the external reference signal; and disconnect the second gate terminal from the signal source to allow the leakage-compensated reference signal to drift. In a second mode of measurement: the reference terminal is configured to receive the external reference signal including a ramping signal; and the second capacitor is configured to couple the ramping signal to the second gate terminal to generate the leakage-compensated reference signal while allowing the leakage-compensated reference signal to drift.

In some aspects, the reference signal comprises a first digital code; the counter is a first counter; and the count value of the first counter is first count value. The leakage compensation circuit comprises a digital to analog converter (DAC), a second counter, and an arithmetic circuit. The second counter is configured to periodically update a second count value representing the accumulative quantity of charge leaked from the capacitor via the first gate terminal since the measurement period starts. The arithmetic circuit is configured to output a compensated digital code based on the first digital code and the second count value. The DAC is configured to output an analog representation of the leakage-compensated version of the reference signal based on the compensated digital code.

In some aspects, in a first mode of measurement, the arithmetic circuit is configured to receive a single first digital code of a fixed reference signal during the measurement period. In a second mode of measurement, the arithmetic circuit is configured to receive a plurality of first digital codes of a ramping reference signal during the measurement period.

In some aspects, the leakage compensation circuit is configured to generate the leakage-compensated version of the input signal based on transferring charge to the capacitor to replenish charge leaked from the capacitor via the first gate terminal of the comparator.

In some aspects, the capacitor is a first capacitor. The leakage compensation circuit comprises: a ramping voltage source; and a second capacitor coupled between the ramping voltage source and the first gate terminal of the comparator. A rate of ramping of the ramping voltage source is based on at least one of: a rate of charge leakage at the first comparator input terminal, a size of the second capacitor, or a rate of change of input signal.

In some examples, an apparatus is provided. The apparatus comprises a photodiode configured to generate charge responsive to incident light, a capacitor configured to store charge generated by the photodiode to develop a voltage, a reference generator configured to output a reference signal, and an analog-to-digital converter (ADC) circuit. The ADC circuit comprises: a leakage compensation circuit and a quantizer. The leakage compensation circuit is configured to: receive an input signal derived from the voltage, the input signal being susceptible to a drift due to a charge leakage; receive the reference signal; and generate a leakage-compensated signal pair to compensate for the charge leakage, wherein the leakage-compensated signal pair comprises one of: (a) a leakage-compensated version of the input signal and the reference signal, (b) the input signal and a leakage-compensated version of the reference signal, or (c) a leakage-compensated version of the input signal and a leakage-compensated version of the reference signal. The quantizer is configured to perform a leakage-compensated quantization of the input signal based on the leakage-compensated signal pair to generate a digital output representing the voltage.

In some aspects, the capacitor is a first capacitor. The apparatus further comprises a second capacitor coupled between the first capacitor and the quantizer, the second capacitor being configured to generate the input signal from the voltage.

In some aspects, the quantizer comprises a comparator having a first transistor and a second transistor. A first gate terminal of the first transistor is configured to receive a first signal of the leakage-compensated signal pair, the first signal being one of the input signal or the leakage-compensated version of the input signal, the input signal being susceptible to drift due to charge leakage from the second capacitor via the first gate terminal. A second gate terminal of the second transistor is configured to receive a second signal of the leakage-compensated signal pair, the second signal being one of the reference signal or the leakage-compensated version of the reference signal of the input signal of the leakage-compensated signal pair. The comparator is configured to generate a comparison result based on the leakage-compensated signal pair. The quantizer is configured to generate the digital output based on the comparison result.

In some aspects, the quantizer comprises a counter configured to periodically update a count value within the measurement period until the comparison result of the comparator switches. The digital output is based on the last-updated count value.

In some aspects, the leakage compensation circuit is configured to generate the leakage-compensated version of the reference signal from the reference signal based on introducing a time-varying offset with respect to the reference signal, the offset corresponding to an accumulative quantity of charge leaked via the second gate terminal since the measurement period starts.

In some aspects, the leakage compensation circuit is configured to generate the leakage-compensated version of the input signal based on transferring charge to the first capacitor to replenish charge leaked from the capacitor via the first gate terminal of the comparator.

In some examples, a method is provided. The method comprises: receiving, by a leakage compensation circuit, an input signal, the input signal being susceptible to drift due to charge leakage; receiving, by the leakage compensation circuit, a reference signal; generating, by the leakage compensation circuit, a leakage-compensated signal pair to compensate for the charge leakage, wherein the leakage-compensated signal pair comprises one of: (a) a leakage-compensated version of the input signal and the reference signal, (b) the input signal and a leakage-compensated version of the reference signal, or (c) a leakage-compensated version of the input signal and a leakage-compensated version of the reference signal; and performing, by a quantizer, a leakage-compensated quantization of the input signal based on the leakage-compensated signal pair to generate a digital output representing the input signal.

In some aspects, the leakage-compensated version of the reference signal is generated based on introducing a time-varying offset with respect to the reference signal. The time-varying offset tracks the drift of the input signal.

In some aspects, the input signal is susceptible to drift due to charge leakage at an input terminal of the quantizer. The leakage-compensated version of the input signal is generated based on transferring charge to the input terminal of the quantizer to replenish charge leaked from the input terminal.

BRIEF DESCRIPTION OF THE DRAWINGS

Illustrative embodiments are described with reference to the following figures.

FIGS. 1A and 1B are diagrams of an embodiment of a near-eye display.

FIGS. 10A and 10B illustrate techniques for performing quantization.

FIG. 12 illustrates an example effect of charge leakage.

Figure 1A:
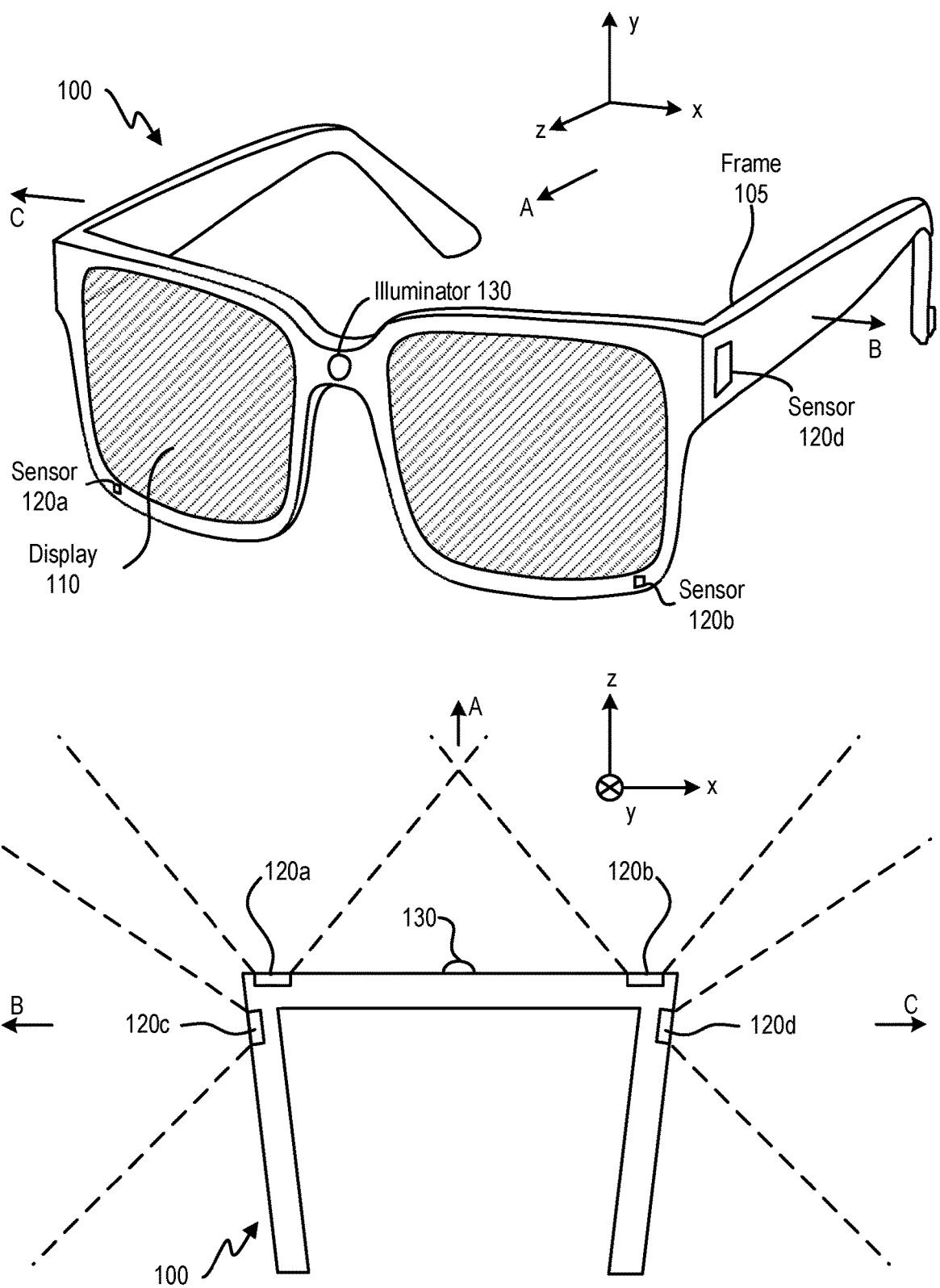

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor includes a photodiode to sense incident light by converting photons into charge (e.g., electrons or holes). The image sensor further includes a floating node configured as a capacitor to collect the charge generated by the photodiode during an exposure period. The collected charge can develop a voltage at the capacitor. The voltage can be buffered by a voltage buffer, which can provide the buffered voltage to an analog-to-digital converter (ADC). The ADC can quantize the buffered voltage into a digital value representing the intensity of the incident light. The ADC typically includes one or more comparators to compare the voltage against one or more references. Each of the one or more references can be associated with a quantization value. Based on the comparison results, the ADC can determine which of the one or more references is the closest to the voltage, and output the quantization value associated with the closes reference to represent the quantity of charge stored at the floating node within the exposure period.

The digital value generated by the ADC may correlate to the intensity of the incident light, but the degree of correlation can be degraded by various factors. First, the quantity of charge stored in the floating node can be directly related to the intensity of the incident light until the floating node reaches a saturation limit. Beyond the saturation limit, the floating node may be unable to accept additional charge generated by the photodiode, and the additional charge may be leaked and not stored. As a result, the quantity of the charge stored at the floating node may be lower than the quantity of charge actually generated by the photodiode. The saturation limit may determine an upper limit of the measureable light intensity of the image sensor.

Various factors can also set a lower limit of the measureable light intensity of the image sensor. For example, the charge collected at the floating node may include noise charge not related to the intensity of incident light. One source of noise charge can be dark current, which can be leakage currents generated at the p-n junction of the photodiode and at the p-n junctions of other semiconductor devices connected to the capacitor, due to crystallographic defects. The dark currents can flow into the capacitor and add charge which are not correlated to the intensity of the incident light. The dark current generated at the photodiode is typically less than the dark current generated at other semiconductor devices. Another (albeit minor) source of noise charge can be due to capacitive coupling with other circuitries.

Besides noise charge, the ADC can also introduce measurement errors in determining the quantity of charge. The measurement errors can degrade the degree of correlation between the digital output and the intensity of the incident light. One source of measurement error is quantization error. In a quantization process, a discrete set of quantity levels can be used to represent a continuous set of quantities of charge, with each quantity level representing a pre-determined quantity of charge. The ADC can compare an input quantity of charge against the quantity levels, determine the quantity level that is closest to the input quantity, and output the determined quantity level (e.g., in the form of digital codes representing the quantity level). Quantization error can occur when there is a mismatch between a quantity of charge represented by the quantity level and the input quantity of charge mapped to the quantity level. The quantization error can be reduced with smaller quantization step sizes (e.g., by reducing the difference in charge quantities between two adjacent quantity levels). Other sources of measurement error may also include, for example, device noises (e.g., of the ADC circuitries) and comparator offsets that add to uncertainties in the measurement of the quantity of charge.

In addition to quantization error, device noises, and comparator offsets, charge leakage can also introduce measurement errors. There are various sources of charge leakages. For example, the input gates of the comparator may leak charge, and the input voltage may drift away from the original input voltage representing the quantity of charge stored at the floating drain node. As another example, charge stored in the floating node may also leak via the voltage buffer. The drift of the input voltage can introduce error to the quantization operation, since the input voltage being measured is not the same as the original input voltage that represents the total charge accumulated at the floating node during the exposure period. As a result, the quantization output does not accurately reflect the real incident light intensity. Charge leakage can substantially degrade the accuracy of light intensity measurement when the quantization time period is relatively large, which allows leakage of a large quantity of charge and a large degree of drifting.

The noise charge (e.g., dark current) and the ADC measurement errors (e.g., charge leakage) can define a lower limit of the measureable light intensity of the image sensor, whereas the saturation limit may determine an upper limit of the measureable light intensity of the image sensor. A ratio between the upper limit and the lower limit defines a dynamic range, which may set a range of operational light intensities for the image sensor. As charge leakage can substantially degrade the accuracy of light intensity measurement especially for low light intensity where the quantity of charge stored in the capacitor is relatively small, charge leakage can raise the lower limit of measureable light intensity and reduce the dynamic range of the image sensor.

Image sensors can be found in many different applications. As an example, image sensors are included in digital imaging devices (e.g., digital cameras, smart phones, etc.) to provide digital imaging. As another example, image sensors can be configured as input devices to control or influence the operation of a device, such as controlling or influencing the display content of a near-eye display in wearable virtual-reality (VR) systems and/or augmented-reality (AR) and/or mixed reality (MR) systems. For example, the image sensors can be used to generate physical image data of a physical environment in which a user is located. The physical image data can be provided to a location tracking system operating a simultaneous localization and mapping (SLAM) algorithm to track, for example, a location of the user, an orientation of the user, and/or a path of movement of the user in the physical environment. The image sensors can also be used to generate physical image data including stereo depth information for measuring a distance between the user and an object in the physical environment. The image sensors can also be configured as a near-infrared (NIR) sensor. An illuminator may project a pattern of NIR light into the eyeballs of the user. The internal structures of the eyeballs (e.g., the pupils) may generate a reflective pattern from the NIR light. The image sensors can capture images of the reflective pattern, and provide the images to a system to track the movement of the eyeballs of the user to determine a gaze point of the user. Based on these physical image data, the VR/AR/MR system may generate and update virtual image data for displaying to the user via the near-eye display, to provide an interactive experience to the user. For example, the VR/AR/MR system may update the virtual image data based on the user's gazing direction (which may signal the user's interest in the object), a location of the user, etc.

A wearable VR/AR/MR system may operate in environments with a very wide range of light intensities. For example, the wearable VR/AR/MR system may be able to operate in an indoor environment or in an outdoor environment, and/or at different times of the day, and the light intensity of the operation environment of the wearable VR/AR/MR system may vary substantially. Moreover, the wearable VR/AR/MR system may also include the aforementioned NIR eyeball tracking system, which may require projecting lights of very low intensity into the eyeballs of the user to prevent damaging the eyeballs. As a result, the image sensors of the wearable VR/AR/MR system may need to have a wide dynamic range to be able to operate properly (e.g., to generate an output that correlates with the intensity of incident light) across a very wide range of light intensities associated with different operating environments. The image sensors of the wearable VR/AR/MR system may also need to generate images at sufficient high speed to allow tracking of the user's location, orientation, gaze point, etc. Image sensors with relatively limited dynamic ranges and which generate images at relatively low speed may not be suitable for such a wearable VR/AR/MR system.

This disclosure relates to a pixel cell that can provide extended dynamic range by mitigating the effect of charge leakage. The pixel cell may include a photodiode, a charge storage unit, a transistor configured as a transfer gate between the photodiode and the charge storage unit, and an analog to digital converter (ADC) circuit. The photodiode can generate charge responsive to incident light and store at least some of the charge until the photodiode saturates. The charge storage unit, which can be a floating drain of the transistor, a metal capacitor, a Metal-Oxide-Semiconductor (MOS) capacitor, or any combination thereof. The charge storage unit can store overflow charge, which is charge overflowing from the photodiode when the photodiode saturates and cannot store additional charge. The transfer gate can also be controlled to transfer charge stored in the photodiode to the charge storage unit.

The ADC circuit can generate a digital output based on the quantity of charge stored in the charge storage unit to represent the incident light intensity. The ADC circuit includes a leakage compensation circuit configured to receive an input signal and a reference signal. The input signal can correspond to a voltage developed at the charge storage unit. The input signal may be received via a capacitor between the charge storage unit and the ADC circuit. The input signal is susceptible to drift due to charge leakage from the capacitor via the ADC circuit, and/or due to charge leakage from the charge storage unit. The leakage compensation circuit can generate a leakage-compensated signal pair to compensate for the charge leakage. The leakage-compensated signal pair comprises one of: (a) a leakage-compensated version of the input signal and the reference signal, (b) the input signal and a leakage-compensated version of the reference signal, or (c) a leakage-compensated version of the input signal and a leakage-compensated version of the reference signal. The ADC circuit further includes a quantizer to perform a leakage-compensated quantization based on the leakage-compensated signal pair to generate a digital representation of the input signal.

More specifically, the quantizer includes a comparator to continuously compare between the input signal and the reference signal within a measurement period to generate one or more comparison results, and the digital representation is generated based on the one or more comparison results. For example, the quantizer may include a counter that periodically updates a count value within the measurement period until the comparison result switches, and the digital representation can be based on the last-updated count value. The first comparator may include a first transistor having a first gate terminal to receive the input signal, and a second transistor having a second gate terminal to receive the reference signal. In some examples, the drift of the input signal can be contributed by charge leakage via the first gate terminal.

Various techniques are proposed to compensate for the drift of the input signal. In one example, the leakage compensation circuit can generate the leakage-compensated version of the reference signal based on introducing a time-varying offset with respect to the reference signal. The offset can correspond to an accumulative quantity of charge leaked via the second gate terminal or via the first gate terminal of the comparator since the measurement period starts. Various techniques are proposed to introduce the time-varying offset to the reference signal. In one example, the ADC circuit includes a reference terminal to receive an external reference signal. The leakage compensation circuit includes a second capacitor coupled between the reference terminal and the second gate terminal of the comparator. The second capacitor can output an internal reference signal to the second gate terminal based on the external reference signal while allowing the internal reference signal to drift. The drift of the input reference signal at the second gate terminal can track the drift of the internal input signal at the first gate terminal (e.g., having the same direction and similar degrees of drifting), and the drifting introduces the time-varying offset. In another example, the leakage compensation circuit includes a digital-to-analog converter (DAC), a second counter, and arithmetic circuit (e.g., an adder, a substractor, etc.). The second counter can periodically update a count value representing, for example, an accumulative quantity of charge leaked via the first gate terminal of the comparator (and/or charge leaked by the charge storage unit) since the measurement period starts. The arithmetic circuit can adjust the reference signal (which can include a digital code) with the count value (e.g., by subtracting the count value from the digital code), and provide the adjusted reference signal to the DAC. The DAC can output an analog representation of the adjusted reference signal to the comparator.

In addition to or in lieu of generating the leakage-compensated version of the reference signal, the leakage compensation circuit can also generate the leakage-compensated version of the input signal. The leakage compensation circuit can replenish the charge leaked from the capacitor via the first gate terminal of the comparator (and/or charge leaked by the charge storage unit) to generate the leakage-compensated version of the input signal. The replenishing of the leaked charge can reduce or eliminate the drift of the input signal. In one example, the leakage compensation circuit comprises a ramping voltage source and a second capacitor coupled between the ramping voltage source and the first gate terminal of the comparator. The ramping voltage source can continuously deposit charge into the second capacitor, which allows the second capacitor to transfer at least some of the additional charge to the first gate terminal to replenish the leaked charge.

With the disclosed techniques, the effect of charge leakage on the accuracy of quantization operation can be mitigated. For example, by introducing a time-varying offset or drift to the reference signal that matches the drift of the input signal, the drifts in the reference signal and in the input signals can cancel out each other completely or to a certain degree in the comparison operation. Moreover, by depositing additional charge to replenish the leaked charge, the drift of the input signal can be eliminated or at least reduced. All these can mitigate the effect of charge leakage on the comparison operation and the quantization operation. As charge leakage can increase the ADC measurement errors which defines the lower limit of the measureable light intensity of the image sensor, mitigating the effect of charge leakage can reduce the ADC measurement errors and extend the lower limit of the measureable light intensity of the image sensor, and the dynamic range of the image sensor can be increased as a result. The disclosed techniques can also improve the performance of an application (e.g., a VR/AR/MR system) that relies on the digital output of the pixel cell, as well as user experience.

The disclosed embodiments may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within field of view of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such arrangement, the accuracy and robustness of tracking a location of the user within the physical environment can be improved.

In some embodiments, near-eye display 100 may further include one or more active illuminator 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 2:
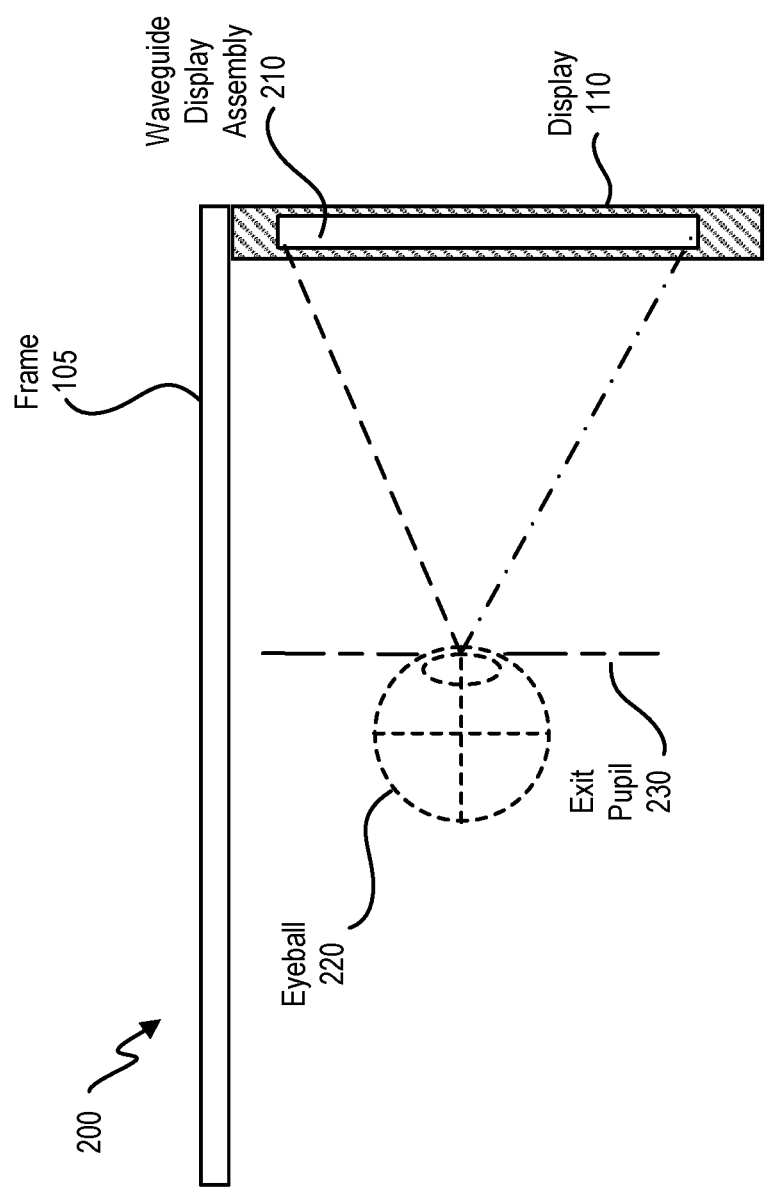
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
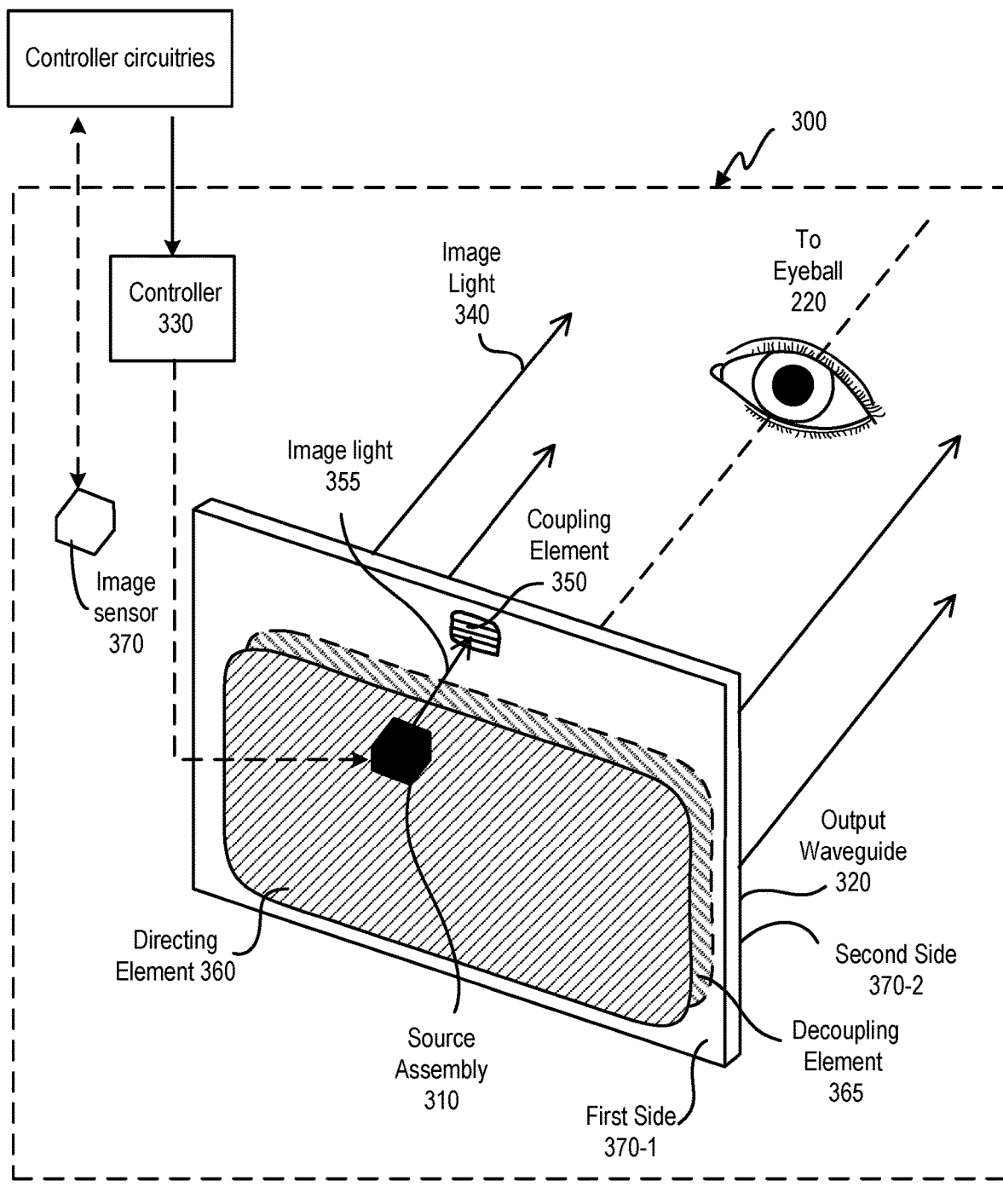
FIG. 3 illustrates an isometric view of an embodiment of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
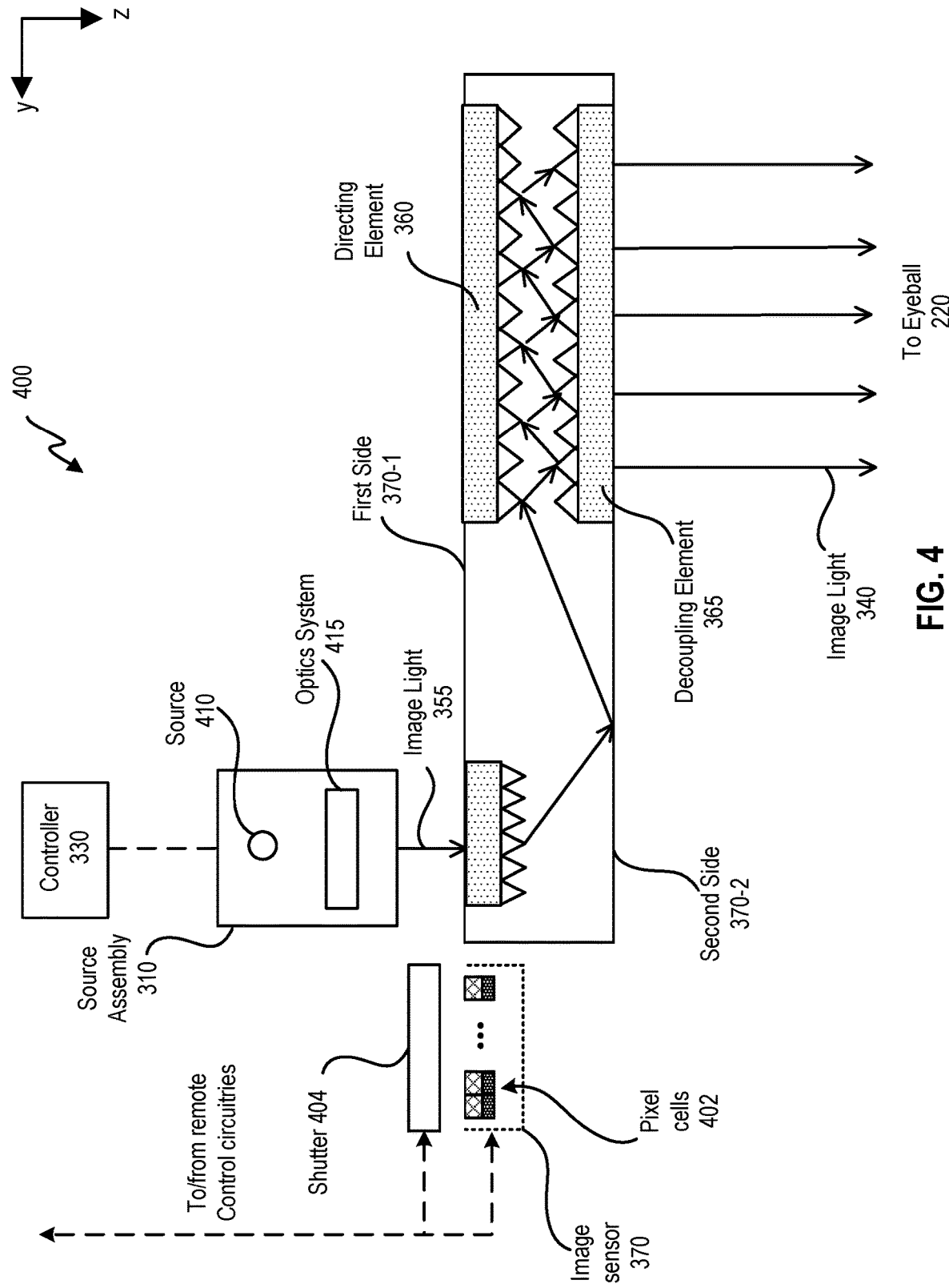
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 interposed between the set of pixel cells 402 and the physical environment to control the exposure of the set of pixel cells 402. In some embodiments, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
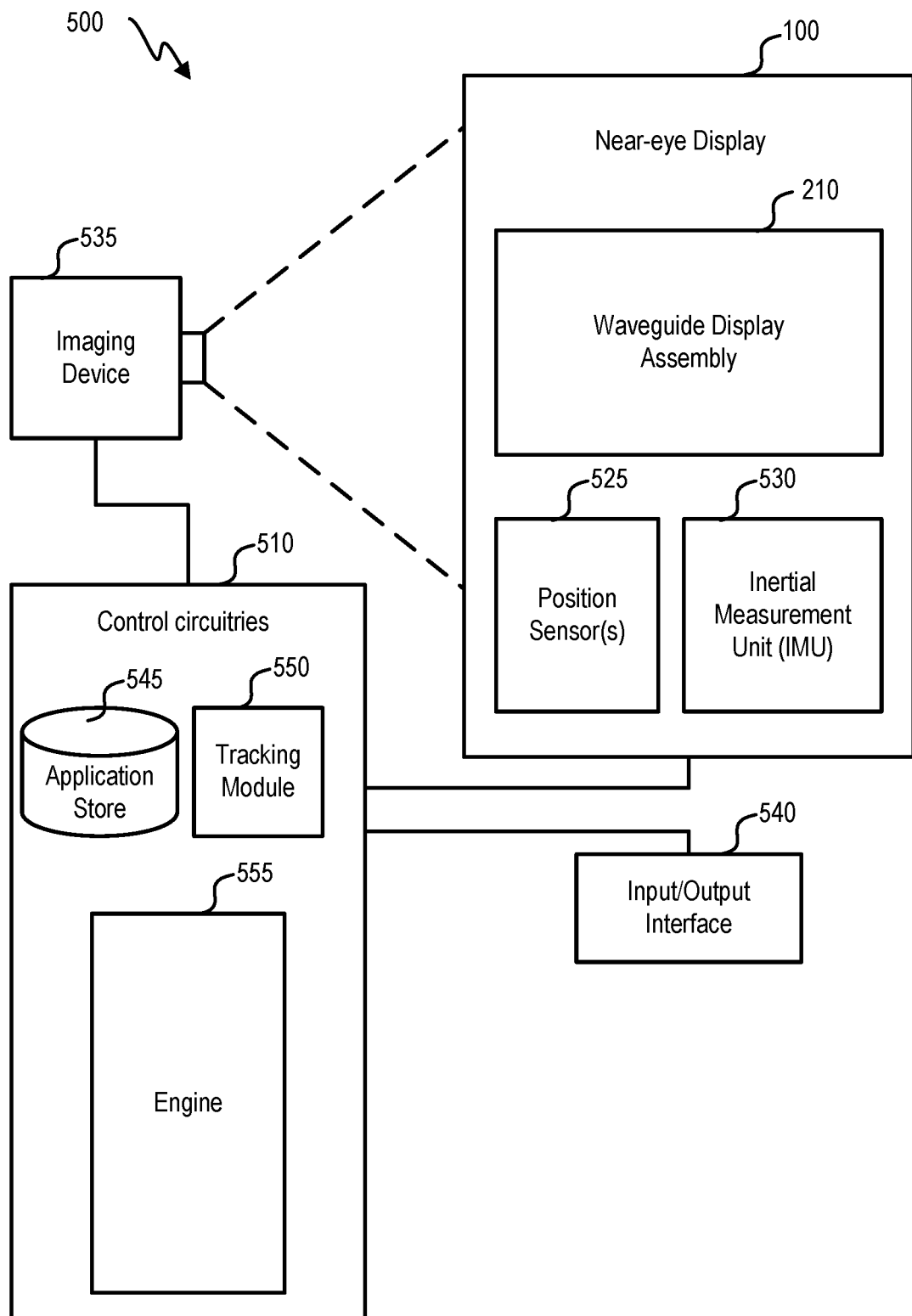
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), or a distance between an object and user (e.g., based on image data provided by imaging device 535).

Figure 6:
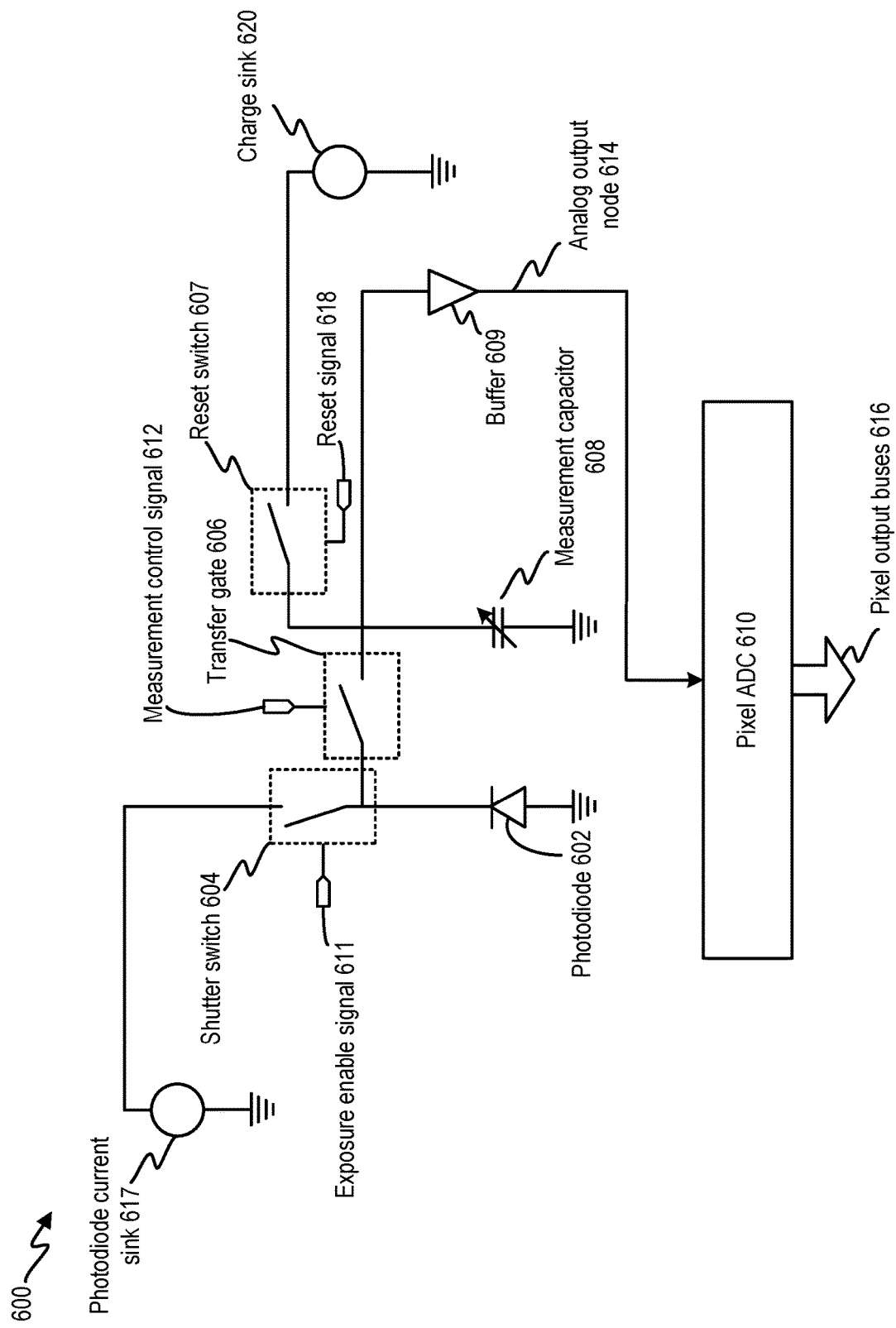
FIG. 6 illustrates block diagrams of embodiments of a pixel cell.

FIG. 6 illustrates an example of a pixel cell 600. Pixel cell 600 may be part of a pixel array and can generate digital intensity data corresponding to a pixel of an image. For example, pixel cell 600 may be part of pixel cells 402 of FIG. 4. As shown in FIG. 6, pixel cell 600 may include a photodiode 602, a shutter switch 604, a transfer gate 606, a reset switch 607, a measurement capacitor 608, a buffer 609, and a pixel ADC 610.

In some embodiments, photodiode 602 may include, for example, a P-N diode, a P-I-N diode, a pinned diode, etc. Photodiode 602 can generate charge upon receiving light, and the quantity of charge generated can be proportional to the intensity of the light. Photodiode 602 can also store some of the generated charge until the photodiode saturates, which occurs when the well capacity of the photodiode is reached. Moreover, each of shutter switch 604, transfer gate 606, and reset switch 607 can include a transistor. The transistor may include, for example, a metal-oxide-semiconductor field-effect transistor (MOSFET), a bipolar junction transistor (BJT), etc. Shutter switch 604 can act as an electronic shutter gate (in lieu of, or in combination with, mechanical shutter 404 of FIG. 4) to control an exposure period of pixel cell 600. During the exposure period, shutter switch 604 can be disabled (turned off) by exposure enable signal 611, which allows photodiode 602 to store the generated charge and, when photodiode 602 saturates, allows the overflow charge to flow to measurement capacitor 608. At the end of the exposure period, shutter switch 604 can be enabled to steer the charge generated by photodiode 602 into photodiode current sink 617. Moreover, reset switch 607 can also be disabled (turned off) by reset signal 618, which allows measurement capacitor 608 to accumulate the charge. Measurement capacitor 608 can be a device capacitor at a floating terminal of transfer gate 606, a metal capacitor, a MOS capacitor, or any combination thereof. Measurement capacitor 608 can be used to store a quantity of charge, which can be measured by pixel ADC 610 to provide a digital output representing the incident light intensity. After a mode of measurement completes, reset switch 607 can be enabled to empty the charge stored at measurement capacitor 608 to charge sink 620, to make measurement capacitor 608 available for the next measurement.

Figure 7:
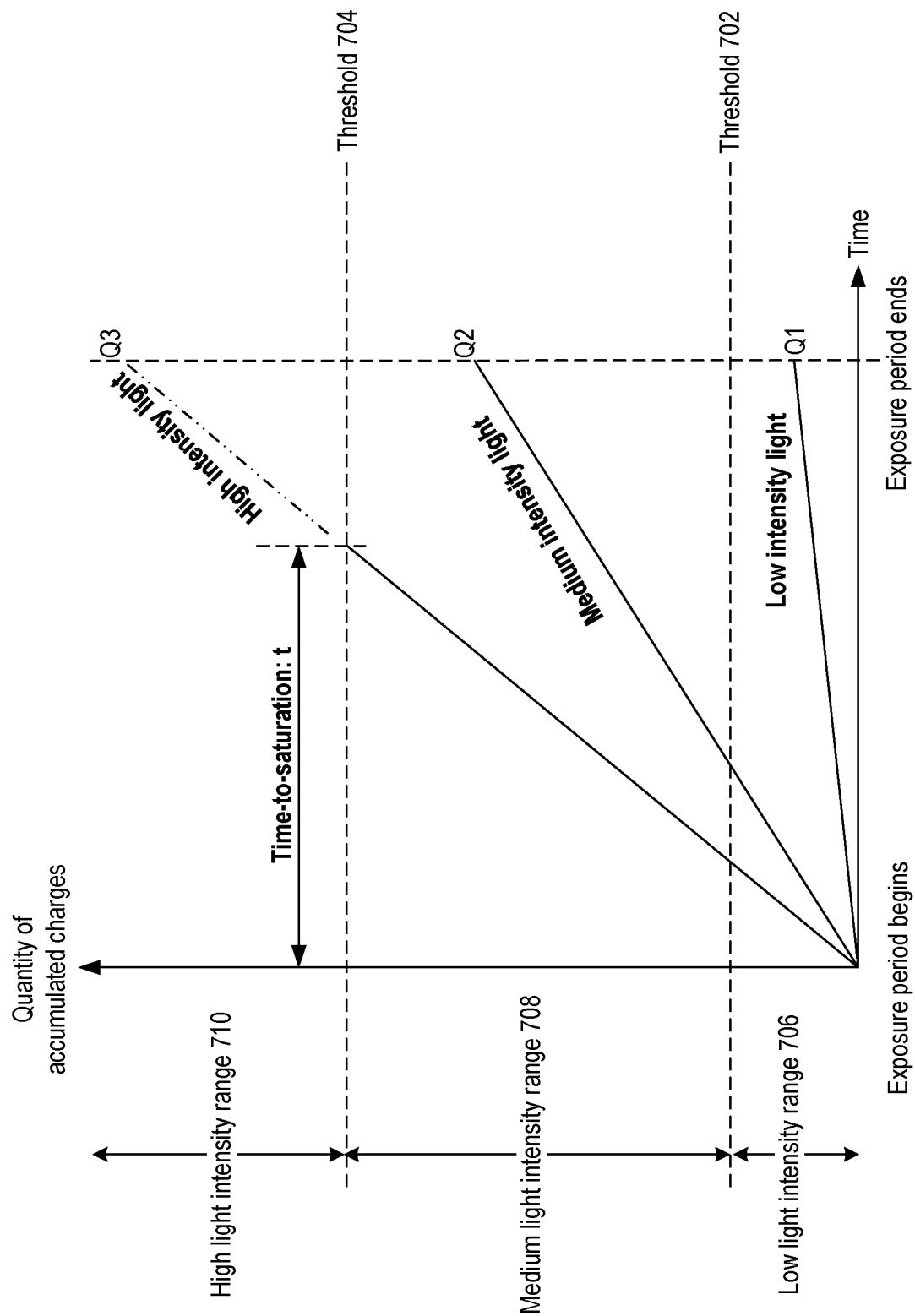
FIG. 7 illustrates operations for determining light intensities of different ranges by embodiments of FIG. 6.

Reference is now made to FIG. 7, which illustrates a quantity of charge accumulated with respect to time for different light intensity ranges. The total quantity of charge accumulated at a particular time point can reflect the intensity of light incident upon photodiode 602 during an exposure period. The quantity can be measured when the exposure period ends. A threshold 702 and a threshold 704 can be defined for thresholds quantity of charge defining a low light intensity range 706, a medium light intensity range 708, and a high light intensity range 710 for the intensity of the incident light. For example, if the total accumulated charge is below threshold 702 (e.g., Q1), the incident light intensity is within low light intensity range 706. If the total accumulated charge is between threshold 704 and threshold 702 (e.g., Q2), the incident light intensity is within medium light intensity range 708. If the total accumulated charge is above threshold 704, the incident light intensity is within high light intensity range 710. The quantity of the accumulated charge, for low and medium light intensity ranges, can correlate with the intensity of the incident light, if the photodiode does not saturate within the entire low light intensity range 706 and the measurement capacitor does not saturate within the entire medium light intensity range 708.

The definitions of low light intensity range 706 and medium light intensity range 708, as well as thresholds 702 and 704, can be based on the storage capacities of photodiode 602 and measurement capacitor 608. For example, low light intensity range 706 can be defined such that the total quantity of charge stored in photodiode 602, at the end of the exposure period, is below or equal to the storage capacity of the photodiode, and threshold 702 can be based on the storage capacity of photodiode 602. As to be described below, threshold 702 can be set based on a scaled storage capacity of photodiode 602 to account for potential capacity variation of the photodiode. Such arrangements can ensure that when the quantity of charge stored in photodiode 602 is measured for intensity determination, the photodiode does not saturate, and the measured quantity relates to the incident light intensity. Moreover, medium light intensity range 708 can be defined such that the total quantity of charge stored in measurement capacitor 608, at the end of the exposure period, is below or equal to the storage capacity of the measurement capacitor, and threshold 704 can be based on the storage capacity of measurement capacitor 608. Typically threshold 704 is also set to be based on a scaled storage capacity of measurement capacitor 608 to ensure that when the quantity of charge stored in measurement capacitor 608 is measured for intensity determination, the measurement capacitor does not saturate, and the measured quantity also relates to the incident light intensity. As to be described below, thresholds 702 and 704 can be used to detect whether photodiode 602 and measurement capacitor 608 saturate, which can determine the intensity range of the incident light and the measurement result to be output.

In addition, in a case where the incident light intensity is within high light intensity range 710, the total overflow charge accumulated at measurement capacitor 608 may exceed threshold 704 before the exposure period ends. As additional charge is accumulated, measurement capacitor 608 may reach full capacity before the end of the exposure period, and charge leakage may occur. To avoid measurement error caused due to measurement capacitor 608 reaching full capacity, a time-to-saturation measurement can be performed to measure the time duration it takes for the total overflow charge accumulated at measurement capacitor 608 to reach threshold 704. A rate of charge accumulation at measurement capacitor 608 can be determined based on a ratio between threshold 704 and the time-to-saturation, and a hypothetical quantity of charge (Q3) that could have been accumulated at measurement capacitor 608 at the end of the exposure period (if the capacitor had limitless capacity) can be determined by extrapolation according to the rate of charge accumulation. The hypothetical quantity of charge (Q3) can provide a reasonably accurate representation of the incident light intensity within high light intensity range 710.

Referring back to FIG. 6, transfer gate 606 can be controlled by a measurement control signal 612 to control the charge accumulations at residual charge capacitor of photodiode 602 and measurement capacitor 608 for different light intensity ranges as described above. To measure high light intensity range 710 and medium light intensity range 708, transfer gate 606 can be controlled to operate in a partially turned-on state. For example, the gate voltage of transfer gate 606 can be set based on a voltage developed at photodiode 602 corresponding to the charge storage capacity of the photodiode. With such arrangements, only overflow charge (e.g., charge generated by the photodiode after the photodiode saturates) will transfer through transfer gate 606 to reach measurement capacitor 608, to measure time-to-saturation (for high light intensity range 710) and the quantity of charge stored in measurement capacitor 608 (for medium light intensity range 708). Moreover, to measure low light intensity range 706, transfer gate 606 can be controlled in a fully turned-on state to transfer the charge stored in photodiode 602 to measurement capacitor 608, to measure the quantity of the charge stored in photodiode 602.

The charge accumulated at measurement capacitor 608 can be sensed by buffer 609 to generate a replica of the analog voltage (but with larger driving strength) at analog output node 614. The analog voltage at analog output node 614 can be converted into a set of digital data (e.g., comprising logical ones and zeros) by pixel ADC 610. The analog voltage developed at measurement capacitor 608 can be sampled and digital output can be generated before the end of the exposure period (e.g., for medium light intensity range 708 and high light intensity range 710), or after the exposure period (for low light intensity range 706). The digital data can be transmitted by a set of pixel output buses 616 to, for example, control circuitries 510 of FIG. 5, to represent the light intensity during the exposure period.

In some examples, the capacitance of measurement capacitor 608 can be configurable to improve the accuracy of light intensity determination for low light intensity range. For example, the capacitance of measurement capacitor 608 can be reduced when measurement capacitor 608 is used to measure the residual charge stored at residual charge capacitor. The reduction in the capacitance of measurement capacitor 608 can increase the charge-to-voltage conversion ratio at measurement capacitor 608, such that a higher voltage can be developed for a certain quantity of stored charge. The higher charge-to-voltage conversion ratio can reduce the effect of measurement errors (e.g., quantization error, comparator offset, etc.) introduced by pixel ADC 610 on the accuracy of low light intensity determination. The measurement error can set a limit on a minimum voltage difference that can be detected and/or differentiated by pixel ADC 610. By increasing the charge-to-voltage conversion ratio, the quantity of charge corresponding to the minimum voltage difference can be reduced, which in turn reduces the lower limit of a measurable light intensity by pixel cell 600 and extends the dynamic range. On the other hand, for medium light intensity, the capacitance of measurement capacitor 608 can be increased to ensure that the measurement capacitor 608 has sufficient capacity to store a quantity of charge up to, for example, the quantity defined by threshold 704.

Figure 8:
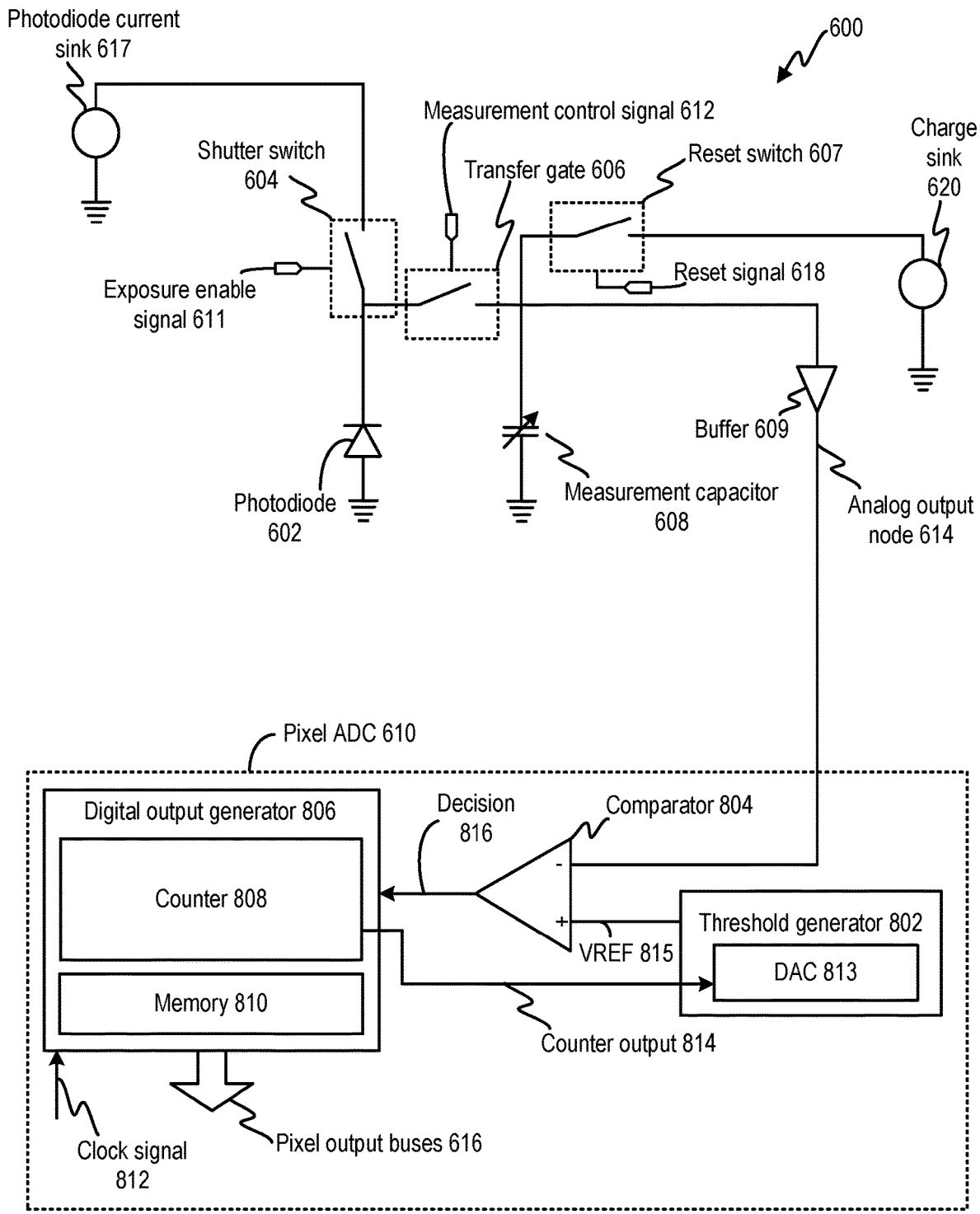
FIG. 8 illustrates examples of internal components of the pixel cell of FIG. 6.

FIG. 8 illustrates an example of the internal components of pixel ADC 610. As shown in FIG. 8, pixel ADC 610 includes a threshold generator 802, a comparator 804, and a digital output generator 806. Digital output generator 806 may further include a counter 808 and a memory device 810. Counter 808 can generate a set of count values based on a free-running clock signal 812, whereas memory 810 can store at least some of the count values (e.g., the latest count value) generated by counter 808. In some embodiments, memory 810 may be part of counter 808. Memory 810 can be, for example, a latch circuit to store the counter value based on local pixel value as described below. Threshold generator 802 includes a digital-to-analog converter (DAC) 813 which can accept a set of digital values and output a reference voltage (VREF) 815 representing the set of digital values. As to be discussed in more detail below, threshold generator 802 may accept static digital values to generate a fixed threshold, or accept output 814 of counter 808 to generate a ramping threshold.

Although FIG. 8 illustrates that DAC 813 (and threshold generator 802) is part of pixel ADC 610, it is understood that DAC 813 (and threshold generator 802) can be coupled with multiple digital output generators 806 from different pixel cells. Moreover, digital output generator 806 can also be shared among a plurality of multiple pixel cells to generate the digital values.

Comparator 804 can compare the analog voltage developed at analog output node 614 against the threshold provided by threshold generator 802, and generate a decision 816 based on the comparison result. For example, comparator 804 can generate a logical one for decision 816 if the analog voltage at analog output node 614 equals to or exceeds the threshold generated by threshold generator 802. Comparator 804 can also generate a logical zero for decision 816 if the analog voltage falls below the threshold. Decision 816 can control the counting operations of counter 808 and/or the count values stored in memory 810, to perform the aforementioned time-of-saturation measurement of a ramping analog voltage at analog output node 614 as well as quantization processing of the analog voltage at analog output node 614 for incident light intensity determination.

Figure 9B:
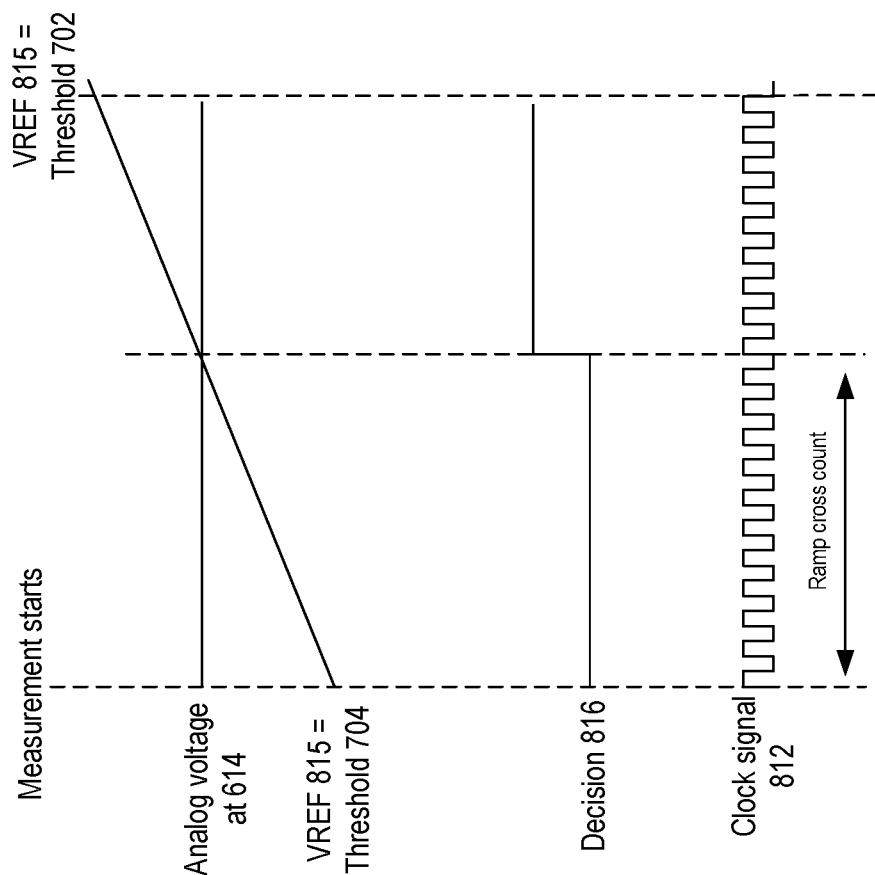
FIGS. 9A and 9B illustrate example methods for determining a light intensity.
Figure 9A:
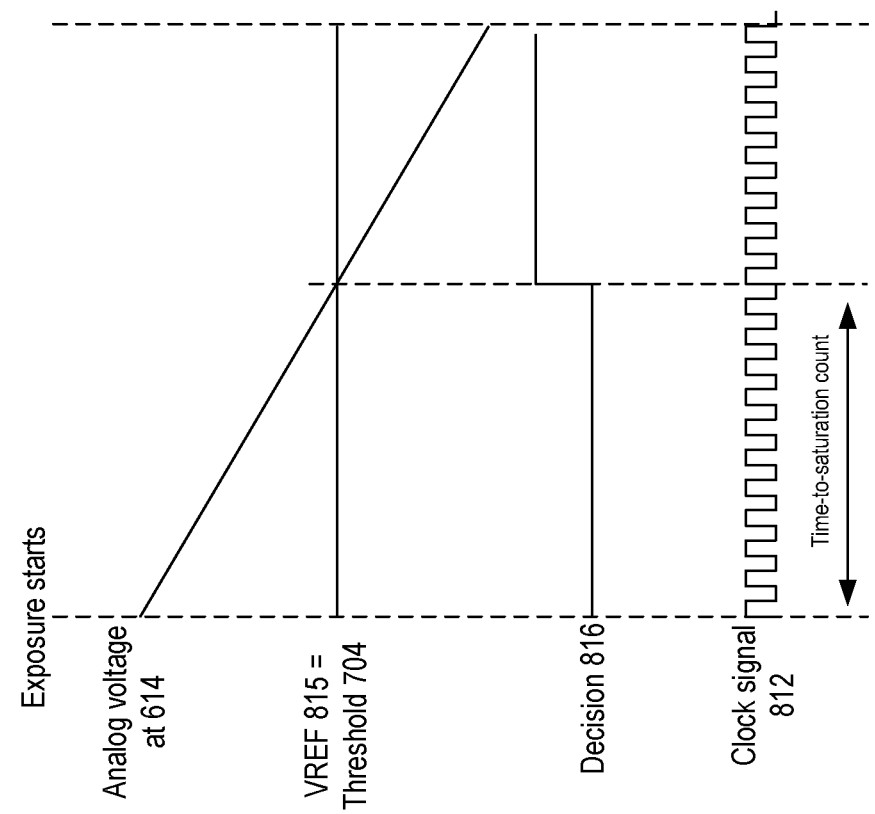

FIG. 9A illustrates an example of time-to-saturation measurement by pixel ADC 610. To perform the time-to-saturation measurement, threshold generator 802 can control DAC 813 to generate a fixed VREF 815. Fixed VREF 815 can be set at a voltage corresponding a charge quantity threshold for saturation of measurement capacitor 608 (e.g., threshold 704 of FIG. 7). Counter 808 can start counting right after the exposure period starts (e.g., right after shutter switch 604 is disabled). As the analog voltage at analog output node 614 ramps down (or up depending on the implementation), clock signal 812 keeps toggling to update the count value at counter 808. The analog voltage may reach the fixed threshold at a certain time point, which causes decision 816 by comparator 804 to flip. The flipping of decision 816 may stop the counting of counter 808, and the count value at counter 808 may represent the time-to-saturation. As to be discussed in more details below, a rate of charge accumulation at measurement capacitor 608 can also be determined based on the duration, and the incident light intensity can be determined based on the rate of charge accumulation.

FIG. 9B illustrates an example of quantizing an analog voltage by pixel ADC 610. After measurement starts, DAC 813 may be programmed by counter output 814 to generate a ramping VREF 815, which can either ramp up (in the example of FIG. 9B) or ramp down depending on implementation. The voltage range of ramping VREF 815 can be between threshold 704 (charge quantity threshold for saturation of measurement capacitor 608) and threshold 702 (charge quantity threshold for saturation of photodiode 602), which can define the medium light intensity range. In the example of FIG. 9B, the quantization process can be performed with uniform quantization steps, with VREF 815 increasing (or decreasing) by the same amount for each clock cycle of clock signal 812. The amount of increase (or decrease) of VREF 815 corresponds to a quantization step. When VREF 815 reaches within one quantization step of the analog voltage at analog output node 614, decision 816 by comparator 804 flips. The flipping of decision 816 may stop the counting of counter 808, and the count value can correspond to a total number of quantization steps accumulated to match, within one quantization step, the analog voltage. The count value can become a digital representation of the quantity of charge stored at measurement capacitor 608, as well as the digital representation of the incident light intensity. As discussed above, the quantization of the analog voltage can occur during the exposure period (e.g., for medium light intensity range 708) and after the exposure period (e.g., for low light intensity range 706).

As discussed above, ADC 610 can introduce quantization errors when there is a mismatch between a quantity of charge represented by the quantity level output by ADC 610 (e.g., represented by the total number of quantization steps) and the actual input quantity of charge that is mapped to the quantity level by ADC 610. The quantization error can be reduced by using a smaller quantization step size. In the example of FIG. 9B, the quantization error can be reduced by the amount of increase (or decrease) in VREF 815 per clock cycle.

Although quantization error can be reduced by using smaller quantization step sizes, area and performance speed may limit how far the quantization step can be reduced. With smaller quantization step size, the total number of quantization steps need to represent a particular range of charge quantities (and light intensity) may increase. A larger number of data bits may be needed to represent the increased number of quantization steps (e.g., 8 bits to represent 255 steps, 7 bits to represent 127 steps, etc.). The larger number of data bits may require additional buses to be added to pixel output buses 616, which may not be feasible if pixel cell 600 is used on a head-mounted device or other wearable devices with very limited spaces. Moreover, with a larger number of quantization step size, ADC 610 may need to cycle through a larger number of quantization steps before finding the quantity level that matches (with one quantization step), which leads to increased processing power consumption and time, and reduced rate of generating image data. The reduced rate may not be acceptable for some applications that require high frame rate (e.g., an application that tracks the movement of the eyeball).

One way to reduce quantization error is by employing a non-uniform quantization scheme, in which the quantization steps are not uniform across the input range. FIG. 10A illustrates an example of a mapping between the ADC codes (the output of the quantization process) and the input charge quantity level for a non-uniform quantization process and a uniform quantization process. The dotted line illustrates the mapping for the non-uniform quantization process, whereas the solid line illustrates the mapping for the uniform quantization process. For the uniform quantization process, the quantization step size (denoted by $\Delta_1$) is identical for the entire range of input charge quantity. In contrast, for the non-uniform quantization process, the quantization step sizes are different depending on the input charge quantity. For example, the quantization step size for a low input charge quantity (denoted by $\Delta_S$) is smaller than the quantization step size for a large input charge quantity (denoted by $\Delta_L$). Moreover, for the same low input charge quantity, the quantization step size for the non-uniform quantization process ($\Delta_S$) can be made smaller than the quantization step size for the uniform quantization process ($\Delta_1$).

One advantage of employing a non-uniform quantization scheme is that the quantization steps for quantizing low input charge quantities can be reduced, which in turn reduces the quantization errors for quantizing the low input charge quantities, and the minimum input charge quantities that can be differentiated by ADC 610 can be reduced. Therefore, the reduced quantization errors can push down the lower limit of the measureable light intensity of the image sensor, and the dynamic range can be increased. Moreover, although the quantization errors are increased for the high input charge quantities, the quantization errors may remain small compared with high input charge quantities. Therefore, the overall quantization errors introduced to the measurement of the charge can be reduced. On the other hand, the total number of quantization steps covering the entire range of input charge quantities may remain the same (or even reduced), and the aforementioned potential problems associated with increasing the number of quantization steps (e.g., increase in area, reduction in processing speed, etc.) can be avoided.

FIG. 10B illustrates an example of quantizing an analog voltage by pixel ADC 610 using a non-uniform quantization process. Compared with FIG. 9B (which employs a uniform quantization process), VREF 815 increases in a non-linear fashion with each clock cycle, with a shallower slope initially and a steeper slope at a later time. The differences in the slopes are attributed to the uneven quantization step sizes. For lower counter count values (which correspond to a lower input quantity range), the quantization steps are made smaller, hence VREF 815 increases at a slower rate. For higher counter count values (which correspond to a higher input quantity range), the quantization steps are made larger, hence VREF 815 increases at a higher rate. The uneven quantization steps in VREF 815 can be introduced using different schemes. For example, as discussed above, DAC 813 is configured to output voltages for different counter count values (from counter 808). DAC 813 can be configured such that the difference in the output voltage between two neighboring counter count values (which defines the quantization step size) is different for different counter count values. As another example, counter 808 can also be configured to generate jumps in the counter count values, instead of increasing or decreasing by the same count step, to generate the uneven quantization steps. In some examples, the non-uniform quantization process of FIG. 10B can be employed for light intensity determination for low light intensity range 706 and medium light intensity range 708.

Figure 11:
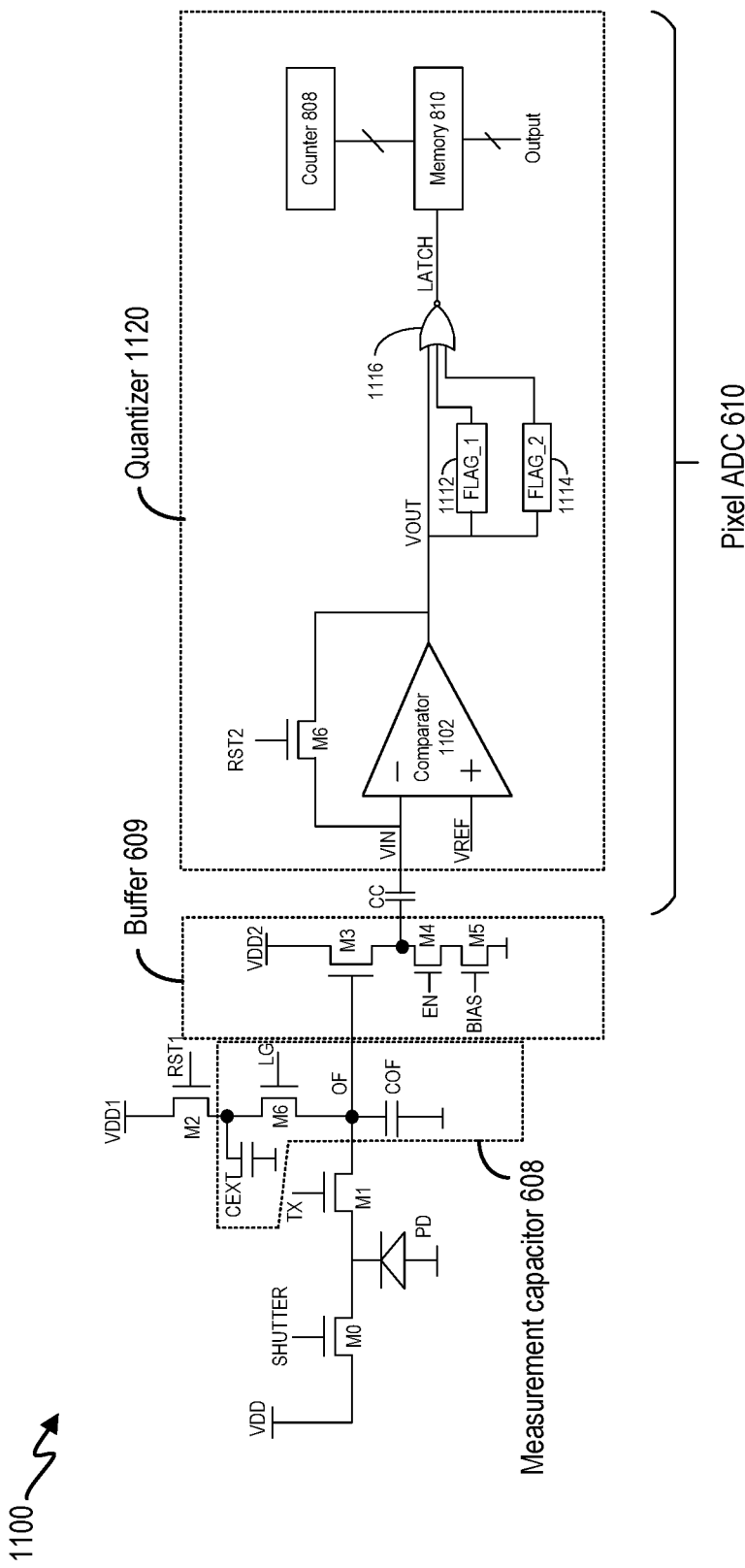
FIG. 11 illustrates block diagrams of an embodiment of a pixel cell.

Reference is now made to FIG. 11, which illustrates an example of pixel cell 1100, which can be an embodiment of pixel cell 600 of FIG. 6. In the example of FIG. 11A, PD can correspond to photodiode 602, transistor M0 can correspond to shutter switch 604, transistor M1 can correspond to transfer gate 606, whereas transistor M2 can correspond to reset switch 607. Moreover, a combination of COF and CEXT capacitors can correspond to measurement capacitor 608. The capacitance of measurement capacitor 608 is configurable by the signal LG. When LG is enabled, measurement capacitor 608 provides combined capacities of COF and CEXT capacitors. When LG is disabled, the CEXT capacitor can be disconnected from the parallel combination, and measurement capacitor 608 comprises only COF capacitor (plus other parasitic capacitances). As discussed above, the capacitance of measurement capacitor 608 can be reduced to increase the charge-to-voltage conversion ratio for the low light intensity determination, and can be increased to provide the requisite capacity for the medium light intensity determination.

Pixel cell 1100 further includes an example of buffer 609 and an example of pixel ADC 610. For example, transistors M3, M4, and M5 form a switchable source follower which can be buffer 609 of FIG. 6 to buffer an analog voltage developed at the OF node, which represents a quantity of charge stored at the COF capacitor (or at the COF and CEXT capacitors). The source follower can be switched on/off by the EN signal. Pixel ADC 610 includes a CC capacitor which can generate a VIN voltage that tracks the analog voltage developed at the OF node. Moreover, comparator 1102, transistor M6, registers 1112 and 1114, NOR gate 1116, together with counter 808 and memory 810 can form a quantizer 1120, which can be part of pixel ADC 610. Quantizer 1120 can quantize VIN to generate a digital output representing the analog voltage at the OF node. As described above, the quantization can be based on a comparison result (VOUT), generated by comparator 1102, between the analog voltage developed at the OF node and VREF. VREF can be a static voltage for time-of-saturation measurement (for high light intensity range) or a ramping voltage for quantization of an analog voltage (for low and medium light intensity ranges). Memory 810 can store the count values from counter 808 until VOUT flips, which can disable the LATCH signal and prevents memory 810 from updating the stored count value. The count value stored in memory 810 can be output as the digital representation of the incident light intensity. In some examples, the generation of VREF for low and medium light intensity determination can be based on a non-uniform quantization scheme as discussed in FIG. 10A and FIG. 10B.

In addition, pixel cell 1100 further includes a controller. The controller can generate a sequence of control signals, such as SHUTTER, TX, RST1, RST2, etc., to operate pixel cell 1100 to perform a three-phase measurement operation corresponding to the three light intensity ranges of FIG. 7 (e.g., low light intensity range 706, medium light intensity range 708, and high light intensity range 710). In each phase, pixel cell 1100 can be operated in a measurement mode targeted for the corresponding light intensity range, and determine whether the incident light intensity falls within the corresponding light intensity range based on the decision output (VOUT) of comparator 1102. Pixel cell 1100 further includes registers 1112 and 1114 to store the decision outputs of some of the phases as FLAG_1 and FLAG_2 signals. Based on the FLAG_1 and FLAG_2 signals, the controller can select the count value from one of the three phases to represent the incident light intensity. The selected count value can be stored in memory 810, and memory 810 can be locked based on a combination of the FLAG_1 and FLAG_2 signals by NOR gate 1116 to prevent subsequent measurement phases from overwriting the count value in memory 810. At the end of the three-phase measurement process, the controller can retrieve the count value stored in memory 810 and provide the count value as the digital output representing the incident light intensity.

Pixel cell 1100 includes techniques that can further improve the accuracy of the incident light intensity determination, in addition to the techniques disclosed above. For example, the combination of the CC capacitor and transistor M6 of comparator 1102 can be used in an auto-zeroing operation to compensate for measurement errors (e.g., comparator offset) introduced by comparator 1102, as well as other error signals that are introduced to comparator 1102. The noise signals may include, for example, a reset noise charge introduced by reset switch 607, a noise signal at the output of buffer 609 due to source follower threshold mismatches, etc.

Specifically, during a reset phase, the capacitors CEXT and COF can be reset by enabling transistors M2 and M6. The voltage at the OF node can include noise charge introduced by transistors M2 and M6. The OF node voltage can be buffered by voltage buffer 609, which can add a noise signal to the buffer output representing source follower threshold mismatches. The voltage buffer can deposit charge representing the noise charge and noise signal (e.g., due to source follower threshold mismatches) on the left plate of the CC cap. In addition, transistor M6 is enabled, which shorts the output of comparator 1102 to its negative input terminal. With the positive input terminal of comparator 1102 grounded, the Vin voltage at the negative input terminal can represent the offset voltage of comparator 1102, and charge representing the offset voltage of comparator 1102 can be deposited on the right plate of the CC capacitor. At the end of the reset phase, charge representing the noise charge, noise signal, and the offset voltage of comparator 1102 can be stored in the CC cap. A voltage difference can also be developed across the CC capacitor during the reset phase due to the stored charge. During a measurement phase, the voltage difference across the CC capacitor remains, and the CC capacitor can track the output voltage of buffer 609 by subtracting away (or adding) the voltage difference to generate the new VIN. The noise charge and noise signal included in the new VIN, as well as the offset voltage of comparator 1102, can be zeroed-out (cancelled) as a result. With such arrangements, the VIN voltage can be compensated for the measurement errors and the error signals, which improves the accuracy of the comparison between VIN and VREF and the ensuing quantization.

Although the use of CC capacitor in the auto-zeroing operation can improve the accuracy of comparison, the CC capacitor (together with the disabling of transistor M6) can leave the negative input terminal of comparator 1102 floating, which allows VIN to drift. As shown on the left of FIG. 12, comparator 1102 may include a first transistor 1202 and a second transistor 1204. The gate terminal of first transistor 1202 can be connected to the right plate of the CC capacitor to receive the VIN voltage, whereas the gate terminal of second transistor 1204 can be connected to a signal source (e.g., DAC 813 of threshold generator 802) to receive the VREF voltage. As shown on the right of FIG. 12, charge may leak from the right plate of the CC capacitor via the gate terminal of first transistor 1202 to the drain and source terminals of first transistor 1202 at a rate $\Delta Q/\Delta t$. The charge leakage can be through gate oxide tunneling current. A leakage path can be formed from gate to substrate path 1210, gate to drain path 1212, and gate to source path 1214. The gate oxide capacitance can define the charge leakage rate. After the CC capacitor sets the initial VIN voltage (represented by $VIN_{initial}$) at time $T_{start}$, the charge leakage can cause the VIN voltage to drift away by a voltage offset $\Delta V(t)$. The voltage offset $\Delta V(t)$ is a function of time and can be related to the accumulative quantity of charge leaked from the CC capacitor since the time $T_{start}$, as follows:

$$\Delta V(t) = \frac{(\Delta Q / \Delta t) \times t}{C}. \quad \text{(Equation 1)}$$

In Equation 1, t represents the duration of time of drifting (e.g., since time $T_{start}$ when the CC capacitor is charged with the initial VIN voltage $VIN_{initial}$), whereas C represents the capacitance of the CC cap. In a case where charge leakage from measurement capacitor 608 (e.g., COF and/or CEXT) also contributes to the drift of VIN, $\Delta Q/\Delta t$ can be the combined rate of charge leakage at the measurement capacitor and at the CC cap.

The voltage offset $\Delta V(t)$ can be large for a relatively long measurement period. For example, as shown in FIG. 9A and FIG. 9B, a relatively long measurement period is provided for comparator 1102 to continuously compare VIN with a reference signal (e.g., a fixed threshold as in FIG. 9A, a ramping threshold as in FIG. 9B) to determine when the comparator output switches. During the measurement period, as charge continues to leak, the VIN voltage continues to drift and a large voltage offset $\Delta V$ may result. As to be discussed in detail below, the drift of VIN can lead to incorrect switching of the comparator output. Incorrect decisions of the incident intensity range and setting of the FLAG_1 and FLAG_2 signals can be made, which can lead to substantial error in the digital output.

Figure 13A:
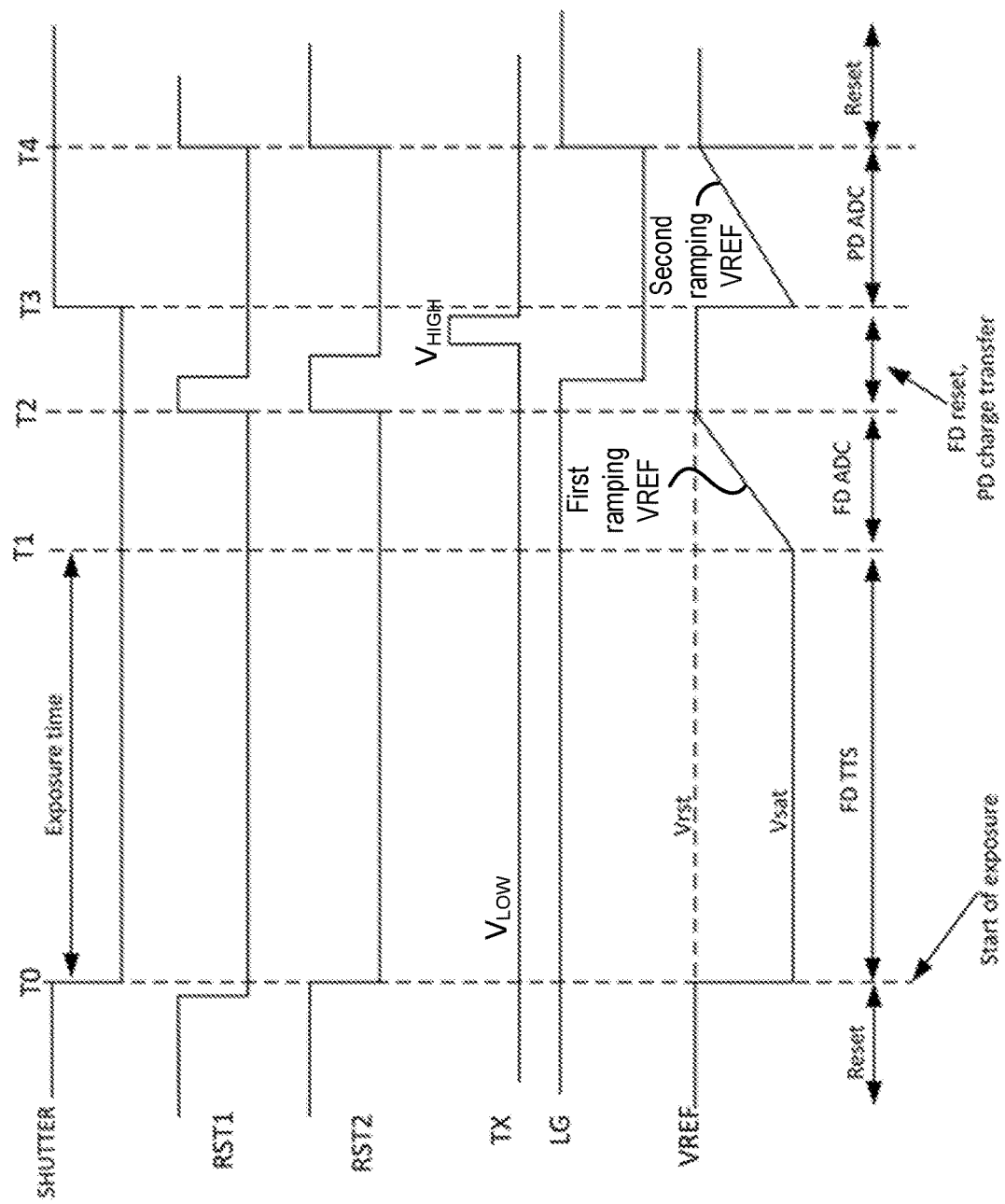
FIGS. 13A, 13B, and 13C illustrate an example process for measuring light intensity, and the effect of charge leakage on the process.

Reference is now made to FIG. 13A, which illustrates a sequence of the control signals of pixel cell 1100 for the three-phase measurement operation with respect to time. Referring to FIG. 13A, the time before T0 corresponds to a first reset phase. The time period between T0 and T1 corresponds to an exposure period and a time-to-saturation measurement mode. The time period between T1 and T2 corresponds to a measurement mode to measure a quantity of overflow charge stored in a floating drain. The measurement mode for measurement of overflow charge is labelled "FD ADC" in FIG. 13A and can be used to measure medium light intensity 708. In addition, the time period between T2 and T3 includes a second reset phase followed by transfer of charge stored in photodiode 602 to the floating drain. Moreover, the time period between T3 and T4 corresponds to a measurement mode to measure a quantity of charge stored in the photodiode and transferred to the floating drain. The measurement mode for measuring the charge stored in the photodiode is labelled "PD ADC" in FIG. 13A and can be used to measure low light intensity 706. Pixel cell 1100 can provide the digital output representing the incident light intensity at time T4, and then start the next three-phase measurement operation.

As shown in FIG. 13A, before T0, the RST1 and RST2 signals, the LG signal, and the shutter signal, are asserted, whereas the TX signal is biased at a voltage $V_{LOW}$. $V_{LOW}$ can correspond to the charge capacity of the photodiode PD to allow only overflow charge (if any) to flow from the photodiode PD to the CEXT capacitor and the COF capacitor via transistor M1. With such arrangements, both photodiode PD, as well as the CEXT capacitor and the COF capacitor, can be reset. Moreover, no charge is added to the capacitors because the charge generated by photodiode PD is diverted away by transistor M0. The voltage across the photodiode PD, as well as the OF node, can be set to a voltage equal to Vrst, which can represent a state where the photodiode PD, the CEXT capacitor, and the COF capacitor do not store any charge. Further, comparator 1102 is also in a reset phase, and the CC capacitor can store charge reflecting the reset noise introduced by M2, the comparator offset, the threshold mismatch of buffer 609, etc. In addition, the VREF can also be set to a value equal to Vrst. In some examples, Vrst can be equal to a supply voltage (e.g., VDD) to pixel cell 1100.

During the time period between T0 and T1, the shutter signal is de-asserted, while the LG signal remains asserted and the TX signal remains at $V_{LOW}$. VREF can be set to a value equal to Vsat, which can correspond to a voltage of the OF node when both CEXT and COF capacitors are at capacity. The difference between Vsat and Vrst can correspond to, for example, threshold 704 of FIG. 7. During the time period between T0 and T1, a time-to-saturation (TTS) measurement can be performed, in which overflow charge flows from the photodiode PD to the COF capacitor and the CEXT capacitor via transistor M1 to develop a ramping voltage at OF node. A buffered and error-compensated version of analog voltage at the OF node (VIN) can be compared against Vsat while counter 808 is free-running. If the total charge stored at the COF capacitor and the CEXT capacitor exceeds threshold 704 (based on the OF node voltage), comparator 1102 will trip, and the count value generated by counter 808 at the time of flipping can be stored into memory 810. The flipping of comparator 1102 also causes controller 1110 to store a value of 1 for FLAG_1 signal in register 1112. The non-zero FLAG_1 signal value can cause the output of NOR gate 1116 to remain low regardless of other inputs to the NOR gate, and can lock the memory and prevent subsequent measurement phases from overwriting the count value. On the other hand, if comparator 1102 never flips during the time period between T1 and T2, which indicates that the incident light intensity is below the high light intensity range, FLAG_1 signal stays zero. Controller 1110 does not update the FLAG 2 value stored in register 1114 between time period T0-T1, and the FLAG 2 value can remain zero.

During the time period between T1 and T2, which corresponds to the second phase of measurement, the analog voltage at the OF node can be quantized by ADC 610, to measure the quantity of overflow charge stored in the CEXT capacitor and the COF capacitor (labelled "FD ADC"). In some examples, during the time period T1-T2, photodiode PD can be shielded from incident light (e.g., by mechanical shutter 404), so that the total overflow charge stored in the CEXT capacitor and the COF capacitor, and the analog voltage at the OF node, remain constant. A first ramping VREF can be supplied to comparator 1102 to be compared against the buffered and error-compensated version of analog voltage at the OF node (VIN). The first ramping VREF can be generated by a DAC based on count values from the free running counter. If the ramping VREF matches VIN (within one quantization step), comparator 1102 will trip, and the count value generated by counter 808 at the time of flipping can be stored into memory 810, if the memory is not locked by the first phase of measurement (as indicated by the zero value of FLAG_1 signal). If the memory is locked, the count value will not be stored into memory 810.

At the beginning of the time period between T2 and T3, both RST1 and RST2 signals can be asserted again for a second reset phase. The purpose of the second reset phase is to reset the CEXT and COF capacitors, and to prepare the COF capacitor for storing charge transferred from the PD capacitor in the third phase of measurement (for low light intensity range). The LG signal can also be de-asserted to disconnect the CEXT capacitor from the COF capacitor and to reduce the capacitance of the measurement capacitor. The reduction of the capacitance is to increase the charge-to-voltage conversion ratio to improve the low light intensity determination, as discussed above. Comparator 1102 is also put into the reset state where the CC capacitor can be used to store the noise charge generated by the resetting of the CEXT and COF capacitors. Towards time T3, after the resetting completes, the RST1 and RST2 signals are de-asserted, whereas the bias TX can increase to $V_{HIGH}$ to fully turn on transistor M1. The charge stored in the photodiode PD can then move into the COF capacitor via M1.

During the time period between T3 and T4, the third phase of measurement can be performed to measure the charge stored in the photodiode (labelled "PD ADC" phase) for the low light intensity range. During that period, the shutter signal is asserted, whereas the TX signal is de-asserted (e.g., setting to zero) or set back to Wow to prevent charge stored at the COF capacitor from leaking via M1. A second ramping VREF can be supplied to comparator 1102 to be compared against the buffered and error-compensated version of analog voltage at the OF node (VIN). If the second ramping VREF matches VIN (within one quantization step), comparator 1102 will trip, and the count value generated by counter 808 at the time of flipping can be stored into memory 810, if the memory is not locked by the first phase of measurement (as indicated by the zero values of FLAG_1 signal).

Figure 13C:
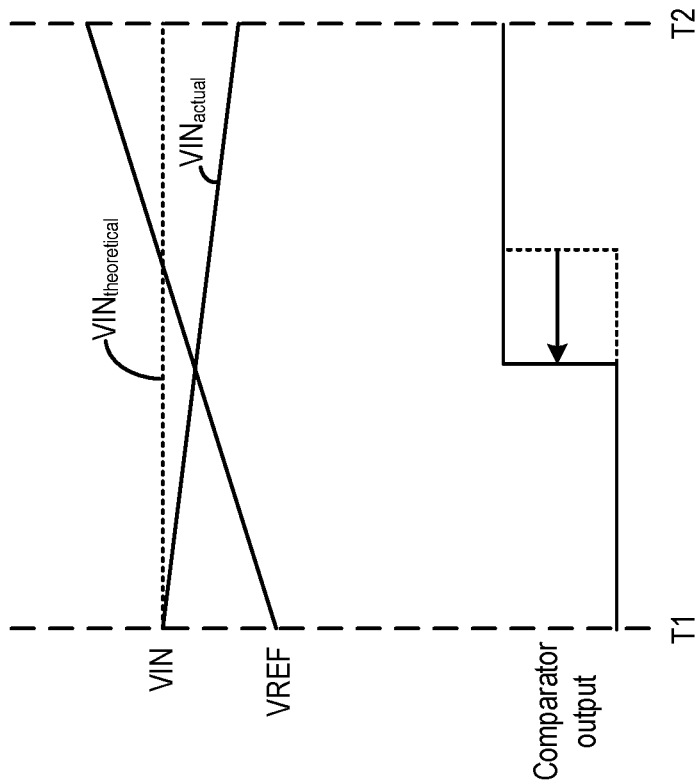
Figure 13B:
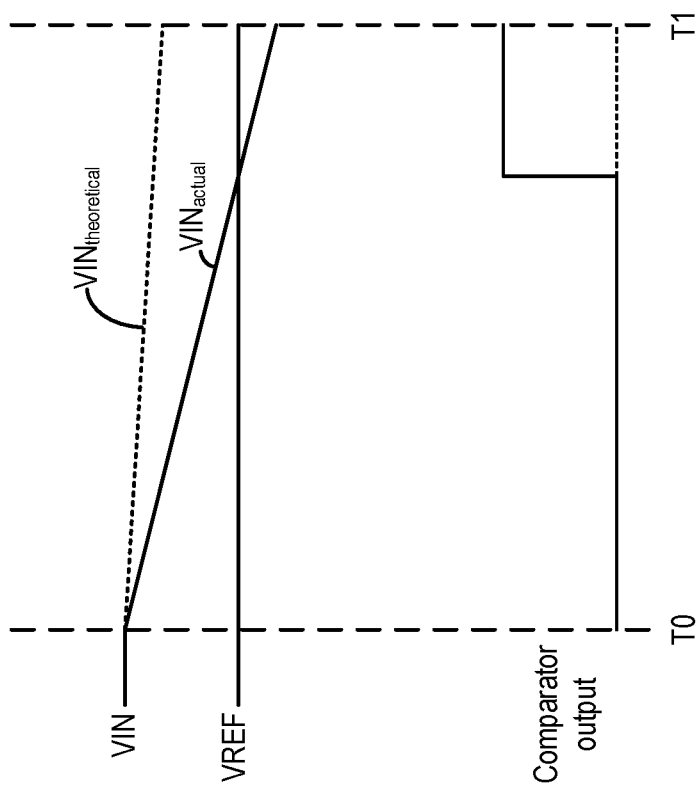

As discussed above, the drift of the input voltage (e.g., VIN) at the comparator input terminal can lead to incorrect switching of the comparator output. Incorrect decisions of the incident intensity range and setting of the FLAG_1 and FLAG_2 signals can be made, which can lead to substantial error in the digital output. FIG. 13B and FIG. 13C illustrate example effects of charge leakage on the time-to-saturation (TTS) measurement and FD ADC/PD ADC measurements of FIG. 13A. As shown in FIG. 13B, between times T0 and T1, TTS measurement is performed between a ramping VIN (caused by accumulation of overflow charge from the photodiode PD) and a VREF corresponding to the saturation limit of the measurement capacitors CEXT and COF. The dotted line labelled "$VIN_{theoretical}$" represents the theoretical ramping VIN caused by the accumulation of overflow charge, while the solid line labelled "$VIN_{actual}$" represents the actual VIN caused by a combination of accumulation of overflow charge and charge leakage. The voltage offset ΔV between $VIN_{theoretical}$ and $VIN_{actual}$ corresponds to an accumulative quantity of charge leaked since T0 which corresponds to the beginning of the TTS measurement period. As shown by the voltage curve of $VIN_{theoretical}$ of FIG. 14A, the total quantity of overflow charge accumulated by the measurement capacitor is not sufficient to push VIN below VREF, which indicates that the intensity of incident light does not fall within the high intensity range of FIG. 7. However, due to charge leakage, $VIN_{actual}$ can go below VREF, which leads to flipping of the comparator output. The flipping of the comparator output incorrectly indicates that the measurement capacitor saturates, and incorrectly asserts the FLAG_1 signal to lock the memory after the TTS phase. The quantization outputs from the subsequent FD ADC and PD ADC phases will not be stored in the memory as a result.

FIG. 13C illustrates an example effect of charge leakage on the FD ADC and PD ADC measurements. As shown in FIG. 13C, the quantity of charge stored in the measurement capacitor during the FD ADC and the PD ADC phases is supposed to be constant, and $VIN_{theoretical}$ should be constant as well. But due to charge leakage, VIN may drift, as represented by $VIN_{actual}$. During FD ADC and PD ADC phases, the VIN is compared with a ramping VREF, and the time at which VIN crosses the ramping VREF, which causes the comparator output to flip, determines the count value to be stored in the memory. As shown in FIG. 13C, as a result of the drift of VIN, the flipping of the comparator output occurs sooner, leading to an incorrect count value being latched into the memory.

Figure 14:
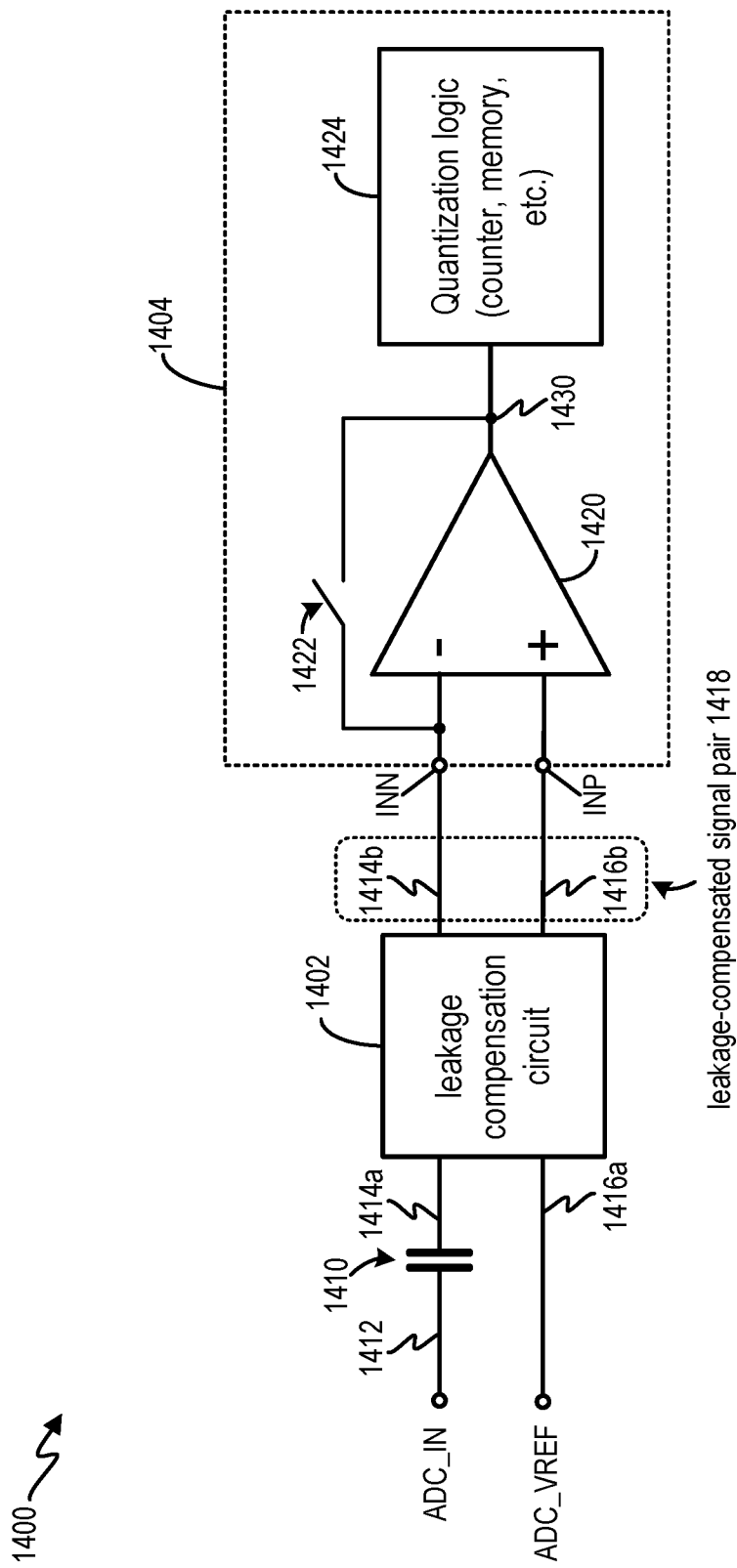
FIG. 14 illustrates an example of an analog-to-digital converter (ADC) circuit that can mitigate the effect of charge leakage.

FIG. 14 illustrates an example of an ADC circuit 1400 that can mitigate the effect of charge leakage. As shown in FIG. 14, ADC circuit 1400 includes a leakage compensation circuit 1402 and a quantizer 1404. In some examples, shown in FIG. 14, a capacitor 1410 may couple across leakage compensation circuit 1402 and an input terminal ADC_IN of ADC circuit 1400 and can store noise information (e.g., noise charge, voltage offset, etc.) for auto-zeroing operation similar to the CC capacitor of FIG. 11. Capacitor 1410 may receive an external signal 1412 from the ADC_IN terminal and output input signal 1414a that tracks external signal 1412 and with the noise information subtracted or added. Input signal 1414a may be susceptible to drift due to charge leakage from capacitor 1410 (and/or from other capacitors, such as the measurement capacitor). In addition, leakage compensation circuit 1402 can receive reference signal 1416a from a reference terminal ADC_VREF of ADC circuit 1400. Leakage compensation circuit 1402 can receive an input signal 1414a and a reference signal 1416a. Leakage compensation circuit 1402 can generate a leakage-compensated signal pair 1418 comprising input signal 1414b and reference signal 1416b based on, respectively, input signal 1414a and reference signal 1416b. Quantizer 1404 can perform a leakage-compensated quantization process based on leakage-compensated signal pair 1418, to generate a digital representation of input signal 1414a of which the impact of drift is eliminated or at least mitigated.

In some examples, leakage compensation circuit 1402 can generate input signal 1416b as a leakage-compensated version of reference signal 1416a. Leakage compensation circuit 1402 can generate reference signal 1416b from reference signal 1416a based on introducing a time-varying offset with respect to reference signal 1416a. Meanwhile, leakage compensation circuit 1402 can forward or buffer input signal 1414a to generate input signal 1414b, such that input signal 1414a and input signal 1414b either become the same signal, or input signal 1416b at least tracks input signal 1414a. The time-varying offset with respect to reference signal 1416a can track the drift of input signal 1414b (e.g., having the same or similar magnitude, and having the same direction), such that both input signal 1414b and reference signal 1416b, as received by quantizer 1404, experience similar or identical drift. In some examples, leakage compensation circuit 1402 may introduce a single offset to compensate for the drift at one time, with the single offset representing the total drift at that time. In some examples, leakage compensation circuit 1402 may introduce multiple offsets at different times to compensate for the total drifts at those times.

Moreover, in some examples, leakage compensation circuit 1402 can generate input signal 1414b as a leakage-compensated version of input signal 1414a, such that input signal 1414b does not drift, or drift to a lesser degree than what input signal 1414a would have experienced due to the charge leakage from capacitor 1410. Leakage compensation circuit 1402 can generate signal 1414b by directly adjusting input signal 1414a (such that signal 1414a and 1414b refer to the same signal), or by generating input signal 1414b as a separate signal from input signal 1414a. Leakage compensation circuit 1402 can provide input signal 1414b to quantizer 1404. Leakage compensation circuit 1402 can also forward or buffer reference signal 1416a to generate reference signal 1416b, or introduce a time-varying offset that matches the reduced drift of input signal 1414b to generate reference signal 1416b, and provide reference signal 1416b to quantizer 1404. In these examples, input signal 1414b and reference signal 1416b may experience no drift, or drift of a lesser degree.

Quantizer 1404 may include a comparator 1420, a switch 1422, and quantization logic 1424. Comparator 1420 includes a negative input terminal INN and a positive input terminal INP. Negative input terminal INN can receive input signal 1414b from leakage compensation circuit 1402, whereas positive input terminal INP can receive reference signal 1416b from leakage compensation circuit 1402. Comparator 1420 can generate a comparison result 1430 based on leakage-compensated signal pair 1418. In an example where leakage compensation circuit directly couples capacitor 1410 with INN terminal (such that input signals 1414a and 1414b are identical signals), input signals 1414a/1414b are susceptible to drift due to charge leakage from capacitor 1410 via negative input terminal INN. Leakage compensation circuit 1402 can generate leakage-compensated signal pair 1418, in which input signal 1414b can be leakage-compensated to have zero or reduced drift, reference signal 1416b can be leakage-compensated to have a drift that tracks the drift of input signal 1414b, or both. The comparison by comparator 1420 can be part of a leakage-compensated quantization process of input signal 1414a of which the impact of drift is eliminated or at least mitigated. Switch 1422 can equalize the negative input and output of comparator 1420 to store charge representing the voltage offset of comparator 1420 in capacitor 1410 as part of the auto-zeroing operation, as described above. Comparison result 1430 can be provided to quantization logic 1424, which can include counter 808 and memory 810, to control the count value stored in the memory. The count value can represent a result of quantizing external signal 1412, of which the impact of drift of internal input signal 1414a is eliminated or at least mitigated.

Figure 15A:
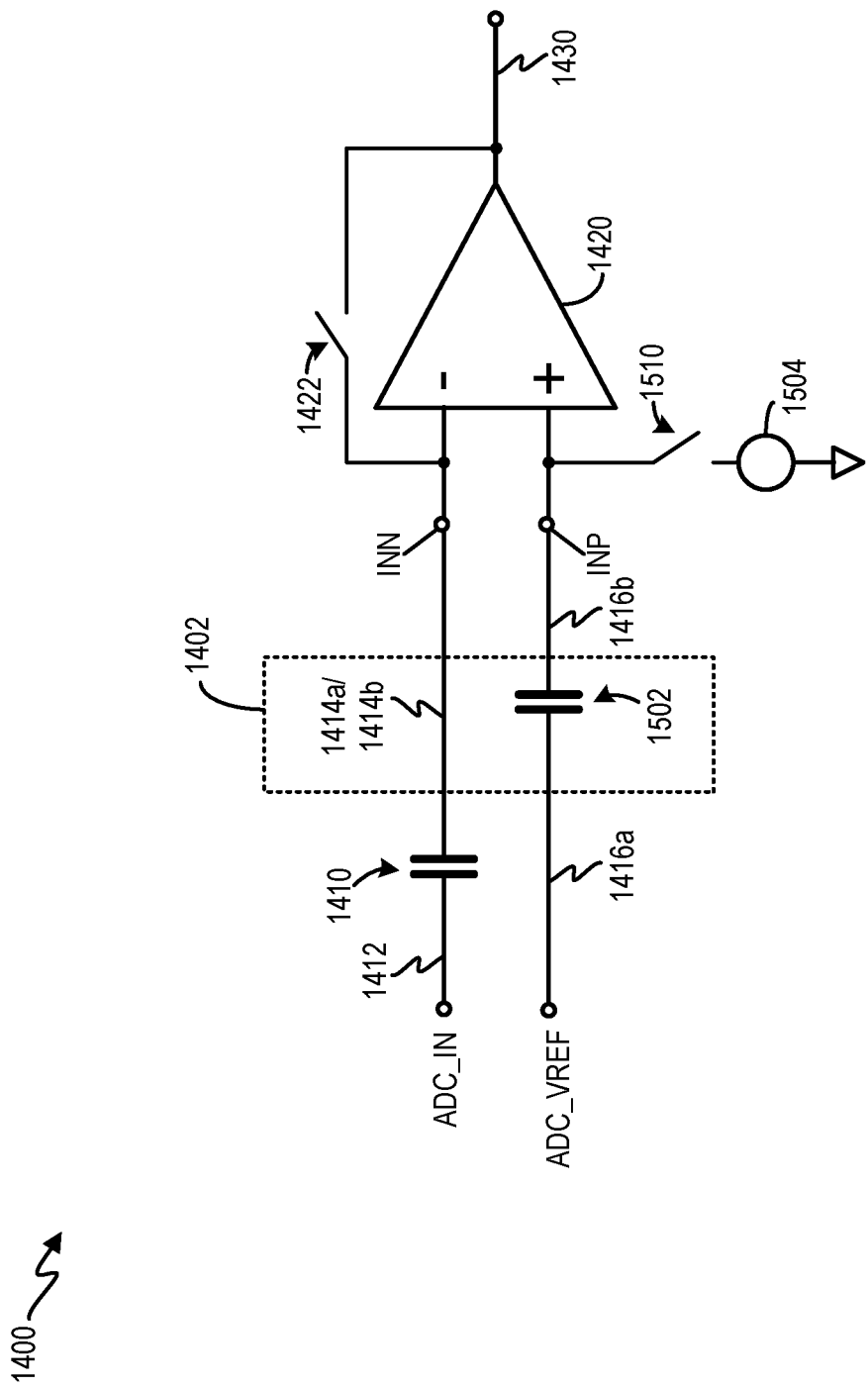
FIGS. 15A, 15B, 15C, and 15D illustrate examples of ADC circuit of FIG. 14 and their operations.
Figure 15C:
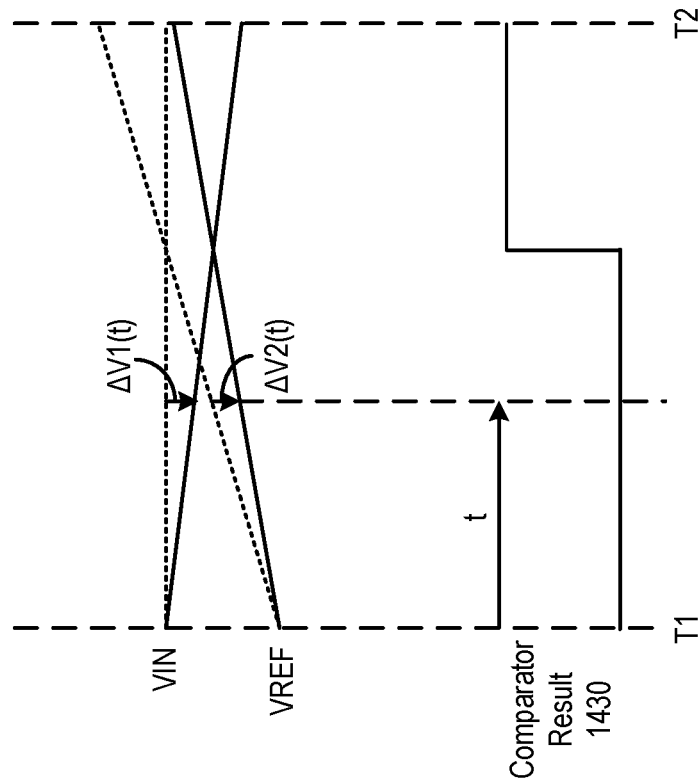
Figure 15B:
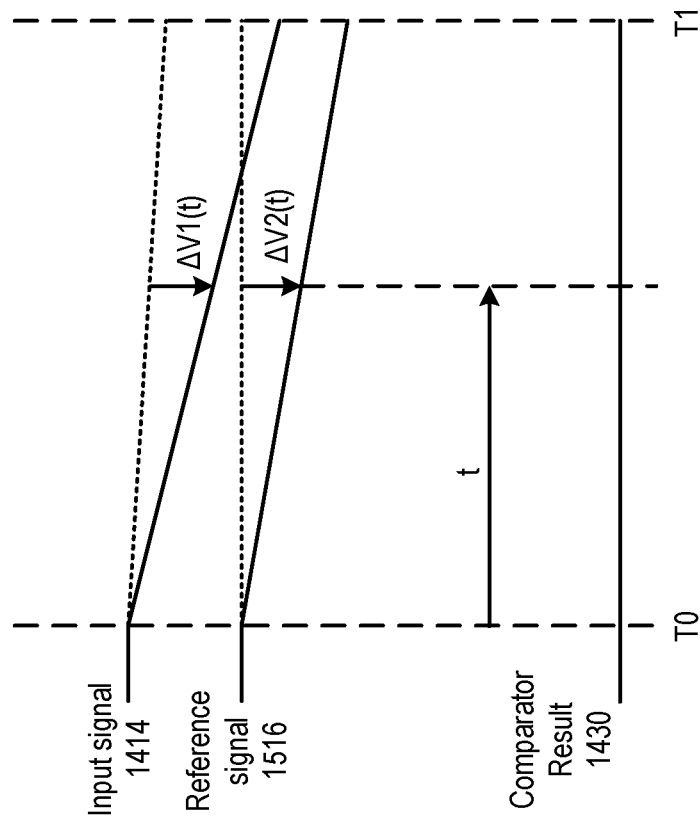

FIG. 15A illustrates an example of leakage compensation circuit 1402, whereas FIG. 15B and FIG. 15C illustrate example operations of the leakage compensation circuit 1402 of FIG. 15A. In FIG. 15A, leakage compensation circuit 1402 can adjust reference signal 1416 based on introducing a time-varying offset to the reference signal, while input signals 1414a/1414b are allowed to drift away from external signal 1412. In FIG. 15A, leakage compensation circuit 1402 can include a capacitor 1502 coupled between the ADC_VREF terminal (of ADC circuit 1400)

and the INP terminal of comparator 1420. Depending on the attributes of the reference signal (e.g., whether it is a fixed reference signal for TTS phase or a ramping reference signal for FD ADC and PD ADC phases), capacitor 1502 can be charged up by reference signal 1416 from ADC_VREF or from a voltage source 1504, to generate reference signal 1416b at the INP terminal having an initial value equal to reference signal 1416a. Reference signal 1416b is then allowed to drift away from the initial value after voltage source 1504 is disconnected from the INP terminal by a switch 1510, and after switch 1422 is disabled. The drift of reference signal 1416b can be caused by charge leakage via the INP terminal.

To compensate for the drift of input signals 1414a/1414b, the drift of reference signal 1416b at any given time within a measurement period can match or at least track the drift of input signals 1414a/1414b at the same time. For example, the drift of reference signal 1416b and input signal 1414a (or 1414b) can be characterized by the same or similar time-varying voltage offset $\Delta V(t)$, and have the same direction of drifting. Various techniques can be used to match the $\Delta V(t)$ between reference signal 1416b and input signal 1414. For example, as shown in Equation 1 above, voltage offset $\Delta V(t)$ is a function of charge leakage rate $\Delta Q/\Delta t$ and capacitance of a capacitor (from which the charge is leaked); therefore, the charge leakage rates $\Delta Q/\Delta t$, as well as the capacitances of capacitor 1410 (which stores the charge that defines input signal 1414) and capacitor 1502 (which stores the charge that defines reference signal 1416b) can be matched. The charge leakage rates $\Delta Q/\Delta t$ can be matched by matching the input transistors of comparator 1420 (e.g., first transistor 1202 and second transistor 1204 of FIG. 12), so that input terminals INN and INP are connected to the same or similar parasitic capacitances.

FIG. 15B and FIG. 15C illustrate examples of operations of leakage compensation circuit 1402 of FIG. 15A for the time-to-saturation (TTS) measurement and FD ADC/PD ADC measurements. FIG. 15B illustrates an example of operation for the TTS measurement. Before the TTS measurement phase starts, the measurement capacitor can be initially reset, and input signal 1414a can settle at a $V_{cmp_{rst}}$ voltage. During the TTS measurement phase, as the photodiode generates and transfers overflow charge to the measurement capacitor, a voltage $\Delta V_{sig}(t)$ can develop with respect to the $V_{cmp_{rst}}$ voltage. In addition, input signal 1414a also drifts due to charge leakage, and the drifting can add a voltage offset $\Delta V1(t)$ to input signal 1414a. Reference signal 1416b can be initialized to $V_{thresh}$ by connecting voltage source 1504 to the INP terminal (and the right plate of capacitor 1502) before TTS measurement phase starts. During the TTS measurement phase, voltage source 1504 can be disconnected from the INP terminal, which allows reference signal 1416b to drift. The drifting can add a voltage offset $\Delta V2(t)$ to input signal 1416b. Input signal 1414a and reference signal 1416b can be characterized by the following equations:

Input signal $1414a(t)=V_{cmp_{rst}}-\Delta V1(t)-\Delta V_{sig}(t)$ (Equation 2)

Reference signal $1416b(t)=V_{thresh}-\Delta V2(t)$. (Equation 3)

As shown in FIG. 15B, both input signal 1414a and reference signal 1416b drift during the TTS measurement phase. Compared with the scenario shown in FIG. 13B, if the drift of both signals track or even match each other, the effect of drift of input signal 1414a can be compensated, and the likelihood of false comparator flipping (represented by comparison result 1430) due to the drift of input signal 1414a can be reduced or eliminated, and a leakage-compensated quantization of input signal 1414a can be performed.

FIG. 15C illustrates an example of operation for the FD ADC or the PD ADC measurement. During the FD ADC or the PD ADC phase, the photodiode stops adding charge to the measurement capacitor. Input signal 1414a also drifts due to charge leakage, and the drifting can add a voltage offset $\Delta V1(t)$ to input signal 1414a. Input signal 1414a can be characterized according to Equation 2 above. Moreover, a ramping VREF signal 1416 ($V_{ramp}(t)$) can be provided at the ADC_VREF terminal of ADC circuit 1400, and capacitor 1502 can couple the ramping VREF signal 1416 to the INP terminal of comparator 1420 to generate reference signal 1416b. The reference signal 1416b also drifts by adding an offset $\Delta V2(t)$. Reference signal 1416b in the FD ADC or the PD ADC phases can be characterized by the following equation:

Reference signal $1416b(t)=V_{ramp}(-t)-\Delta V2(t)$ (Equation 4)

As shown in FIG. 15C, both input signal 1414a and reference signal 1416b drift during the TTS measurement phase. Compared with the scenario shown in FIG. 13C, if the drift of both signals track or even match each other, the effect of drift of input signal 1414a can be compensated, and the likelihood of comparator flipping (represented by comparison result 1430) at the wrong time due to the drift of input signal 1414a, which can lead to generation of incorrect count value, can be reduced or eliminated.

Figure 15D:
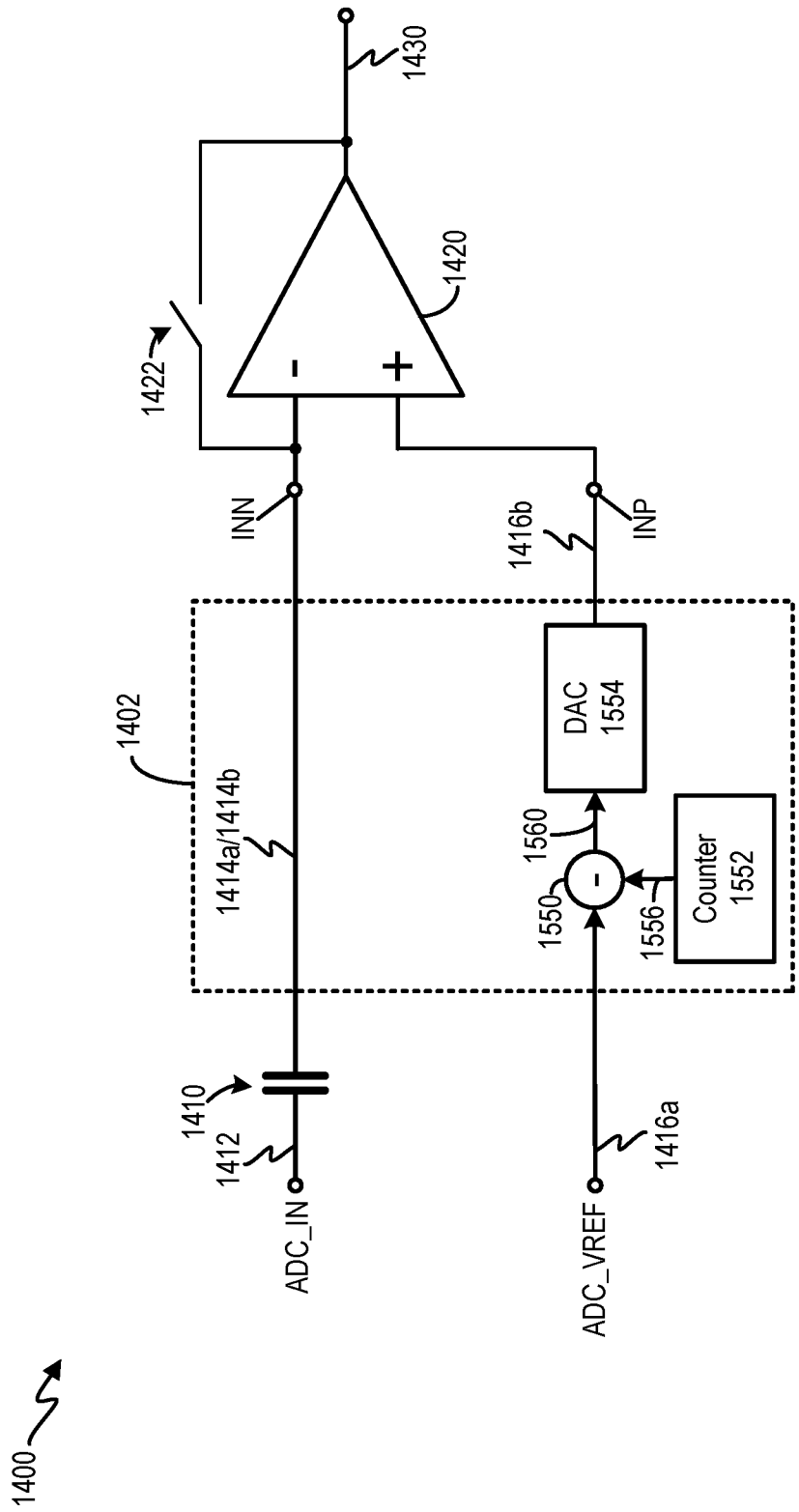

FIG. 15D illustrates another example of leakage compensation circuit 1402 which can adjust reference signal 1416a based on introducing a time-varying offset to the reference signal, while input signal 1414a is not adjusted and allowed to drift away from external signal 1412. As shown in FIG. 15D, leakage compensation circuit 1402 may include an arithmetic circuit 1550 (e.g., a subtractor, an adder, etc.), a counter 1552, and a digital-to-analog converter (DAC) 1554. Reference signal 1416a can be in the form of a digital code representing the reference signal. For TTS measurement, a single digital code representing a fixed reference signal can be provided at the ADC_VREF terminal within the measurement period (e.g., between T0 and T1 of FIG. 13A). For FD ADC and PD ADC measurements, multiple digital codes representing a ramping reference signal can be provided at the ADC_VREF terminal at different times within the measurement period (e.g., between T1 and T2 and between T3 and T4 of FIG. 13A). Counter 1552 (or other digital logic circuit implementing a state machine) can update a count value 1556 that is a digital representation of the time-varying voltage offset $\Delta V(t)$. The time-varying offset $\Delta V(t)$ can track the drift of input signal 1414a. In some examples, counter 1552 (or other digital logic circuit) can be programmed to generate and update count value 1556 based on a pre-determined charge leakage model which characterizes the charge leakage at the terminal INN and/or at the measurement capacitor. Arithmetic circuit 1550 can subtract count value 1556 from digital reference signal 1416a at a single time or at multiple times to generate digital reference signal 1416b, which is a leakage-compensated version of digital reference signal 1416a. Digital reference signal 1416b can be provided to DAC 1554, which can generate the analog reference signal 1416b. The analog reference signal 1416b can be identical to those shown in FIG. 15B and FIG. 15C generated using capacitor 1502. In some examples, a leakage compensation circuit 1402 including DAC 1554 can generate a common leakage-compensated reference signal 1416*b* and supply the reference signal to multiple pixel cells, to reduce the chip area needed to accommodate DAC 1554.

Figure 16A:
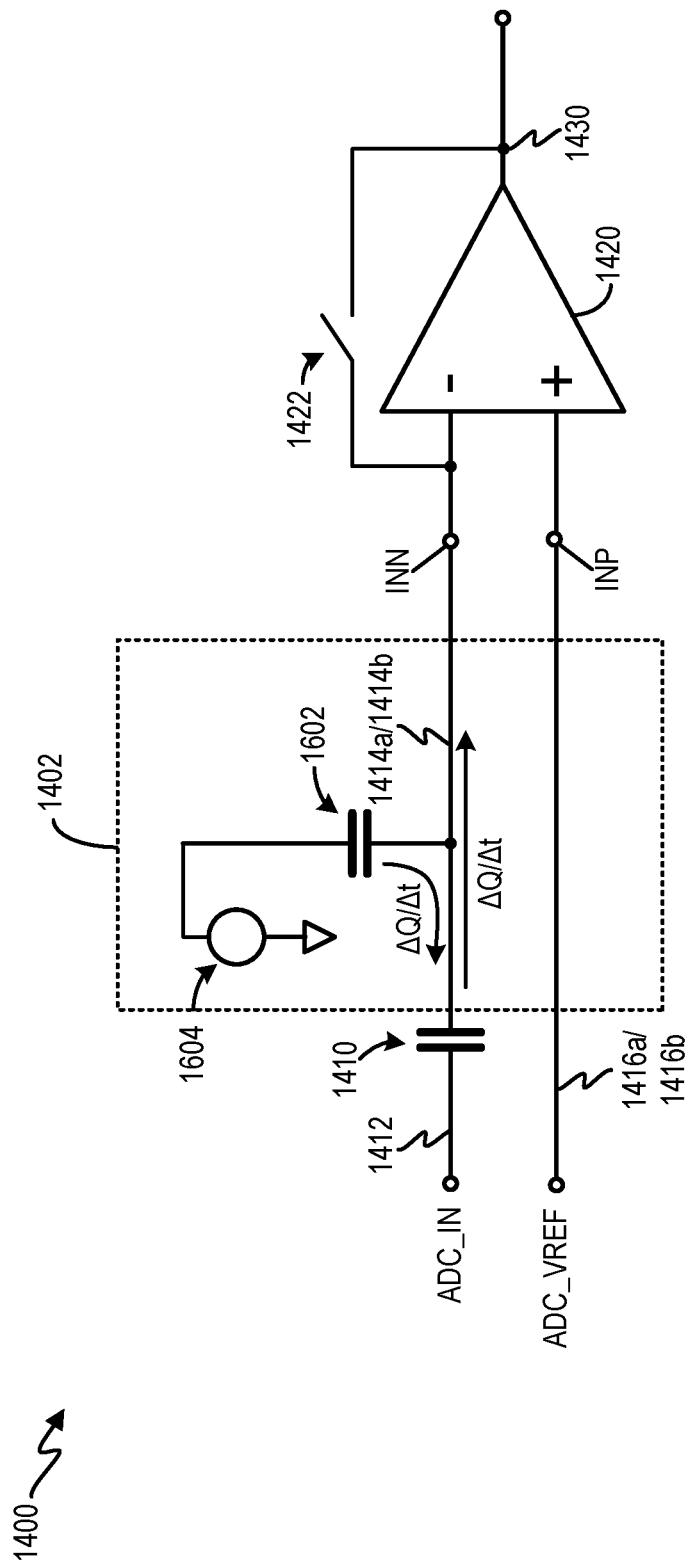
FIGS. 16A and 16B illustrate other examples of ADC circuit of FIG. 14 and their operations.

FIG. 16A illustrates another example of leakage compensation circuit 1402. In FIG. 16A, leakage compensation circuit 1402 can generate input signal 1414*b* from input signal 1414*a* by replenishing the charge leaked from capacitor 1410 via the INN terminal of comparator 1420 (and/or charge leaked by the charge storage unit), to reduce or eliminate the drift of input signal 1414*b* due to charge leakage. As shown in FIG. 16A, leakage compensation circuit 1402 can include a capacitor 1602 and a ramping voltage source 1604. The ramping voltage source 1604 can be configured to continuously deposit charge into capacitor 1602 to directly adjust input signal 1414*a* to provide input signal 1414*b*. At least some of the deposited charge can be transferred from capacitor 1602 to capacitor 1410. If the rate of charge transfer from capacitor 1602 to capacitor 1410 matches the rate of charge leakage from capacitor 1410 via the INN terminal (e.g., ΔQ/Δt), the charge leaked from capacitor 1410 can be replenished, and the drift of input signal 1414*a*/1414*b* due to charge leakage can be reduced or eliminated. Meanwhile, leakage compensation circuit 1402 receives reference signal 1416*a* from ADC_VREF terminal, and forward/buffer reference signal 1416*a* to generate reference signal 1416*b* to the INP terminal of comparator 1420. The techniques shown in FIG. 16A can also be applied at other places within the pixel cell, such as at the OF node of FIG. 11, to replenish the charge leaked from the measurement capacitor via the gate terminal of the voltage buffer.

Figure 16B:
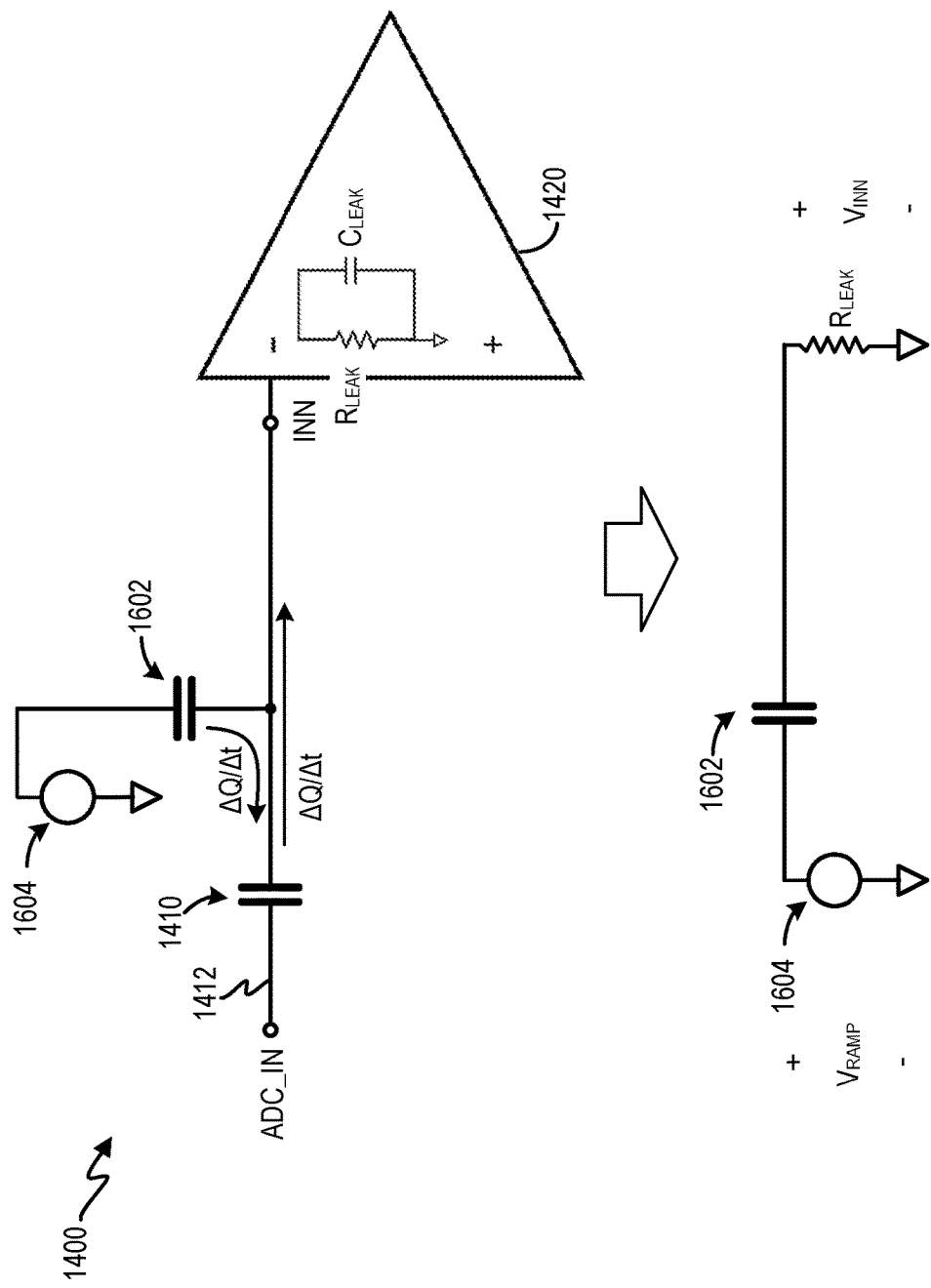

FIG. 16B illustrates a simplified representation of ADC 1400 of FIG. 16A. As shown in FIG. 16B, the gate leakage path of comparator 1420 can be represented by a leakage capacitor $C_{LEAK}$ and a leakage resistance $R_{LEAK}$. The leakage capacitor $C_{LEAK}$ can be defined by the gate oxide capacitance of the input transistor at the INN terminal (e.g., transistor 1202 of FIG. 12), whereas $R_{LEAK}$ can be defined by the resistance of leakage paths (e.g., leakage paths 1210, 1212, and 1214 of FIG. 12). Assuming that the charge leaked by $C_{LEAK}$ is fully replenished by ramping voltage source 1604 via capacitor 1602, the voltage at the INN terminal ($V_{INN}$) can stay constant. The voltage of ramping voltage source 1604 ($V_{RAMP}$) is a function of time (t) and can be a related to the capacitance of capacitor 1602 ($C_{1602}$) and $R_{LEAK}$ based on the following equation:

$$V_{ramp}(t) = V_{INN} + \frac{t \times V_{INN}}{C_{1602} \times R_{LEAK}} \quad \text{(Equation 5)}$$

As shown in Equation 5, the rate of ramping voltage output by ramping voltage source 1604 can be configured based on the capacitance of capacitor 1602 ($C_{1602}$) and leakage resistance $R_{LEAK}$ of comparator 1420.

The capacitance of capacitor 1602 ($C_{1602}$) can be determined based on various factors, such as leakage rate (e.g., based on the value of $R_{LEAK}$), area constraints (how much area available to implement the capacitor), etc. In addition, $C_{1602}$ can also be determined based on a limit on $V_{ramp}$. For example, $V_{ramp}$ can be limited by the breakdown voltage for capacitor dielectric, and the value of $C_{1602}$ can be determined based on an upper limit of $V_{ramp}$ and Equation 5.

In some examples, the techniques of FIG. 16A and FIG. 15A (and/or FIG. 15D) can be combined, such that both the input signal and the reference signal are adjusted. For example, part of the drift of the input signal can be eliminated by capacitor 1602, while the reference signal is adjusted to match the remaining drift of the input signal. Such arrangements can be advantageous. For example, by splitting the drift between the input signal and the reference signal, the amount of drift experienced by both signals can be reduced, which can reduce the risk of one of the signals falling outside the input range of the comparator. Moreover, by reducing the drift, a smaller quantity of charge can be transferred from capacitor 1602 to capacitor 1410, and a smaller capacitor 1602 can be used to provide the charge. With a smaller capacitor 1602, the capacitive loading on the INN terminal can be reduced, which can improve the bandwidth and operation speed of comparator 1420 especially for the TTS measurement, in which comparator 1420 may need to operate at high speed to compare a sharp ramping VIN (caused by rapid generation of charge from the photodiode in response to high intensity incident light) with the reference. As another example, the arrangements of FIG. 15A and FIG. 15D, where reference signal 1416*b* is adjusted, may be unable to completely compensate for the drift of input signals 1414*a*/1414*b* (e.g., due to charge leakage mismatch at INN/INP, finite resolution of the DAC, etc.). In such an example, the arrangements of FIG. 16A can be used to adjust away part of the drift of input signals 1414*a*/1414*b* further improve the matching of the drift between input signal 1414*a*/1414*b* and reference signal 1416*b*. In some examples, a two-tier compensation scheme can also be created by combining the techniques of FIG. 16A and FIG. 15A (and/or FIG. 15D). For example, reference signal compensation can be used to provide coarse-grain compensation, whereas input signal compensation can be used to provide fine-grain compensation (or vice versa), to improve the robustness of the leakage compensation mechanism.

Figure 17:
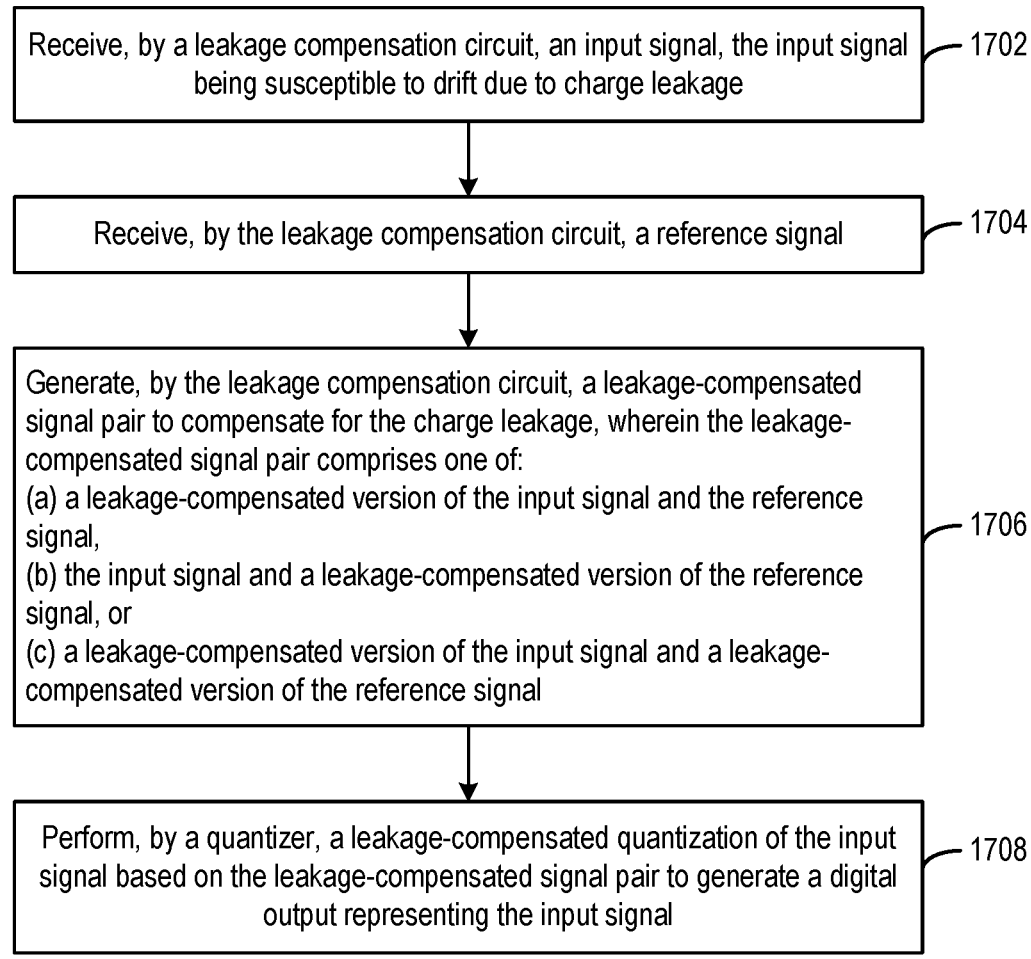
FIG. 17 illustrates an example process for performing quantization.

FIG. 17 illustrates a flowchart of a method 1700 of performing quantization. Method 1700 can be performed by ADC 1400 comprising leakage compensation circuit 1402 and quantizer 1404. ADC 1400 can be used to generate a digital output representing incident light intensity.

In step 1702, leakage compensation circuit 1402 can receive an input signal, such as input signal 1414*a*. Input signal 1414*a* may be driven by a capacitor (e.g., capacitor 1410, a measurement capacitor, etc.) and may be susceptible to drift due to charge leakage from the capacitor.

In step 1704, leakage compensation circuit 1402 can receive a reference signal, such as reference signal 1416*a*. Depending on a measurement mode, reference signal 1416*a* can be a fixed reference signal (e.g., for time-to-saturation measurement for high light intensity) or a ramping reference signal (e.g., for measurement of quantity of stored charge for low and medium light intensities measurements).

In step 1706, leakage compensation circuit 1402 can generate a leakage-compensated signal pair (e.g., leakage-compensated signal pair 1418) to compensate for the charge leakage. The leakage-compensated signal pair comprises one of: (a) a leakage-compensated version of the input signal and the reference signal, (b) the input signal and a leakage-compensated version of the reference signal, or (c) a leakage-compensated version of the input signal and a leakage-compensated version of the reference signal. In some examples, as described above with respect to FIGS. 15A-15D, leakage compensation circuit 1402 can introduce a time-varying offset with respect to reference signal 1416*a* to generate reference signal 1416*b*. Leakage compensation circuit 1402 can forward or buffer input signal 1414*a* to generate input signal 1414*b*, and allow input signals 1414*a*/1414*b* to drift due to charge leakage. The time-varying offset introduced with respect to reference signal 1416*b* can track or even match the drift of input signals 1414a/1414b. The time-varying offset can be introduced by a capacitor and/or by a DAC. In some examples, as described above with respect to FIG. 16, leakage compensation circuit 1402 can eliminate or at least reduce the drift of input signal 1414b based on replenishing the charge that has leaked. For example, leakage compensation circuit 1402 can include a capacitor driven by a ramping source to deposit charge to replenish the leaked charge. In some examples, both the reference signal and the input signal can be leakage-compensated. For example, the drift of the input signal is reduced but not eliminated, and a time-varying offset can be introduced with respect to the reference signal to track/match the reduced drift of the input signal.

In step 1708, a quantizer (e.g., quantizer 1404) can receive the leakage-compensated signal pair from leakage compensation circuit 1402, and perform a leakage-compensated quantization of the input signal based on the leakage-compensated signal pair to generate a digital output. The leakage-compensated quantization can be based on, for example, comparing the original input signal that drifts within a measurement period with a leakage-compensated version of the reference signal having the time-varying offset added to match the drift, comparing the leakage-compensated input signal having reduced or zero drift with the original reference signal, or comparing the leakage-compensated input signal and the leakage-compensated reference signal, to obtain a comparison result. The quantizer may include a free-running counter and a memory, and the comparison result can determine when to store the output of the counter at the memory. The digital output can represent a quantization result of the input signal of which the impact of charge leakage is eliminated or at least reduced.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An analog-to-digital converter (ADC) circuit, comprising:
   a quantizer; and
   a leakage compensation circuit configured to:
      receive an input signal, the input signal being susceptible to a drift due to a charge leakage via an input terminal of the quantizer;
      receive a reference signal; and
      generate a leakage-compensated signal pair to compensate for the charge leakage, wherein the leakage-compensated signal pair comprises one of:
         (a) a leakage-compensated version of the input signal and the reference signal,
         (b) the input signal and a leakage-compensated version of the reference signal, or
         (c) a leakage-compensated version of the input signal and a leakage-compensated version of the reference signal,
      wherein the quantizer is configured to perform a leakage-compensated quantization of the input signal based on the leakage-compensated signal pair to generate a digital output representing the input signal.

2. The ADC circuit of claim 1, wherein:
   the quantizer comprises a comparator having a first transistor and a second transistor;
   a first gate terminal of the first transistor is configured to receive a first signal of the leakage-compensated signal pair, the first signal being one of the input signal or the leakage-compensated version of the input signal, the input signal being susceptible to drift due to charge leakage from the first gate terminal;
   a second gate terminal of the second transistor is configured to receive a second signal of the leakage-compensated signal pair, the second signal being one of the reference signal or the leakage-compensated version of the reference signal of the input signal of the leakage-compensated signal pair;
   one of the first gate terminal or the second gate terminal is connected to the input terminal;

the comparator is configured to generate a comparison result based on the leakage-compensated signal pair; and the quantizer is configured to generate the digital output based on the comparison result.

3. The ADC circuit of claim 2, wherein the quantizer comprises a counter configured to periodically update a count value within a measurement period until the comparison result of the comparator switches; and wherein the digital output is based on the last-updated count value.

4. The ADC circuit of claim 3, wherein the input signal is an internal input signal;

wherein the ADC circuit comprises:
an input terminal configured to receive an external input signal; and
a capacitor coupled between the input terminal and the first gate terminal of the comparator and configured to store information for an auto-zeroing operation of the comparator and to output the internal input signal to the first gate terminal based on the external input signal and the stored information;
wherein the leakage compensation circuit is configured to generate the leakage-compensated signal pair to compensate for charge leakage from the capacitor via the first gate terminal of the comparator within the measurement period.

5. The ADC circuit of claim 4, wherein the leakage compensation circuit is configured to generate the leakage-compensated version of the reference signal from the reference signal based on introducing a time-varying offset with respect to the reference signal, the offset corresponding to an accumulative quantity of charge leaked via the second gate terminal since the measurement period starts.

6. The ADC circuit of claim 5, wherein:
the capacitor is a first capacitor;
the reference signal is an internal reference signal;
the ADC circuit further includes a reference terminal to receive an external reference signal;
the leakage compensation circuit comprises a second capacitor coupled between the reference terminal and the second gate terminal, the second capacitor being configured to output the leakage-compensated version of the reference signal to the second gate terminal based on the external reference signal while allowing the leakage-compensated version of the reference signal to drift at the second gate terminal;
the drift of the leakage-compensated version of the reference signal at the second gate terminal tracks the drift of the internal input signal at the first gate terminal; and
the drift of the leakage-compensated version of the reference signal introduces the time-varying offset with respect to the external reference signal.

7. The ADC circuit of claim 6, wherein:
in a first mode of measurement, the ADC circuit is configured to:
connect the second gate terminal to a signal source of the external reference signal before the measurement period starts to initialize the leakage-compensated version of the reference signal to the external reference signal; and
disconnect the second gate terminal from the signal source to allow the leakage-compensated version of the reference signal to drift; and
in a second mode of measurement:

the reference terminal is configured to receive the external reference signal including a ramping signal; and
the second capacitor is configured to couple the ramping signal to the second gate terminal to generate the leakage-compensated version of the reference signal while allowing the leakage-compensated version of the reference signal to drift.

8. The ADC circuit of claim 4, wherein:
the reference signal comprises a first digital code;
the counter is a first counter;
the count value of the first counter is first count value;
the leakage compensation circuit comprises a digital to analog converter (DAC), a second counter, and an arithmetic circuit;
the second counter is configured to periodically update a second count value representing an accumulative quantity of charge leaked from the capacitor via the first gate terminal since the measurement period starts;
the arithmetic circuit is configured to output a compensated digital code based on the first digital code and the second count value; and
the DAC is configured to output an analog representation of the leakage-compensated version of the reference signal based on the compensated digital code.

9. The ADC circuit of claim 8, wherein in a first mode of measurement, the arithmetic circuit is configured to receive a single first digital code of a fixed reference signal during the measurement period; and
wherein in a second mode of measurement, the arithmetic circuit is configured to receive a plurality of first digital codes of a ramping reference signal during the measurement period.

10. The ADC circuit of claim 4, wherein the leakage compensation circuit is configured to generate the leakage-compensated version of the input signal based on transferring charge to the capacitor to replenish charge leaked from the capacitor via the first gate terminal of the comparator.

11. The ADC circuit of claim 10, wherein the capacitor is a first capacitor;
wherein the leakage compensation circuit comprises:
a ramping voltage source; and
a second capacitor coupled between the ramping voltage source and the first gate terminal of the comparator; and
wherein a rate of ramping of the ramping voltage source is based on at least one of: a rate of charge leakage at the first gate terminal of the comparator, a size of the second capacitor, or a rate of change of input signal.

12. The ADC circuit of claim 1, wherein the leakage compensation circuit is configured to receive the input signal at a first time;
wherein the quantizer is configured to perform a leakage-compensated quantization of the input signal at a second time to generate the digital output representing the input signal received by the leakage compensation circuit at the first time.

13. The ADC circuit of claim 1, wherein:
the input signal is an internal input signal;
the ADC circuit comprises:
an external input terminal configured to receive an external input signal; and
a capacitor coupled between the external input terminal and the input terminal of the quantizer and configured to store charge;
the external input terminal is configured to receive an external input signal;

the internal input signal is derived from the external input signal and the charge; and the drift is due to leakage of the charge from the capacitor via the input terminal of the quantizer.

14. An apparatus comprising:

a photodiode configured to generate charge responsive to incident light;

a capacitor configured to store charge generated by the photodiode to develop a voltage;

a reference generator configured to output a reference signal; and an analog-to-digital converter (ADC) circuit, comprising:
  a quantizer; and
  a leakage compensation circuit configured to:
    receive an input signal derived from the voltage, the input signal being susceptible to a drift due to a charge leakage via an input terminal of the quantizer;
    receive the reference signal;
    generate a leakage-compensated signal pair to compensate for the charge leakage, wherein the leakage-compensated signal pair comprises one of:
      (a) a leakage-compensated version of the input signal and the reference signal,
      (b) the input signal and a leakage-compensated version of the reference signal, or
      (c) a leakage-compensated version of the input signal and a leakage-compensated version of the reference signal,
    wherein the quantizer configured to perform a leakage-compensated quantization of the input signal based on the leakage-compensated signal pair to generate a digital output representing the voltage.

15. The apparatus of claim 14, wherein the capacitor is a first capacitor; and wherein the apparatus further comprises a second capacitor coupled between the first capacitor and the quantizer, the second capacitor being configured to generate the input signal from the voltage.

16. The apparatus of claim 15, wherein:

the quantizer comprises a comparator having a first transistor and a second transistor;

a first gate terminal of the first transistor is configured to receive a first signal of the leakage-compensated signal pair, the first signal being one of the input signal or the leakage-compensated version of the input signal, the input signal being susceptible to drift due to charge leakage from the second capacitor via the first gate terminal;

a second gate terminal of the second transistor is configured to receive a second signal of the leakage-compensated signal pair, the second signal being one of the reference signal or the leakage-compensated version of the reference signal of the input signal of the leakage-compensated signal pair;

one of the first gate terminal or the second gate terminal is connected to the input terminal;

the comparator is configured to generate a comparison result based on the leakage-compensated signal pair; and the quantizer is configured to generate the digital output based on the comparison result.

17. The apparatus of claim 16, wherein the quantizer comprises a counter configured to periodically update a count value within a measurement period until the comparison result of the comparator switches; and wherein the digital output is based on the last-updated count value.

18. The apparatus of claim 17, wherein the leakage compensation circuit is configured to generate the leakage-compensated version of the reference signal from the reference signal based on introducing a time-varying offset with respect to the reference signal, the offset corresponding to an accumulative quantity of charge leaked via the second gate terminal since the measurement period starts.

19. The apparatus of claim 16, wherein the leakage compensation circuit is configured to generate the leakage-compensated version of the input signal based on transferring charge to the first capacitor to replenish charge leaked from the capacitor via the first gate terminal of the comparator.

20. A method comprising:

receiving, by a leakage compensation circuit, an input signal, the input signal being susceptible to drift due to charge leakage via an input terminal of a quantizer;

receiving, by the leakage compensation circuit, a reference signal;

generating, by the leakage compensation circuit, a leakage-compensated signal pair to compensate for the charge leakage, wherein the leakage-compensated signal pair comprises one of:
  (a) a leakage-compensated version of the input signal and the reference signal,
  (b) the input signal and a leakage-compensated version of the reference signal, or
  (c) a leakage-compensated version of the input signal and a leakage-compensated version of the reference signal; and performing, by the quantizer, a leakage-compensated quantization of the input signal based on the leakage-compensated signal pair to generate a digital output representing the input signal.

21. The method of claim 20, wherein the leakage-compensated version of the reference signal is generated based on introducing a time-varying offset with respect to the reference signal; and wherein the time-varying offset tracks the drift of the input signal.

22. The method of claim 20, wherein the input signal is susceptible to drift due to charge leakage at an input terminal of the quantizer; and wherein the leakage-compensated version of the input signal is generated based on transferring charge to the input terminal of the quantizer to replenish charge leaked from the input terminal.

* * * * *